US008442853B2

(12) United States Patent
Abbott

(10) Patent No.: US 8,442,853 B2
(45) Date of Patent: May 14, 2013

(54) TARGETED EQUIPMENT MONITORING SYSTEM AND METHOD FOR OPTIMIZING EQUIPMENT RELIABILITY

(76) Inventor: Patrick D. Abbott, Lake Mary, FL (US)

( * ) Notice: Subject to any disclaimer, the term of this patent is extended or adjusted under 35 U.S.C. 154(b) by 107 days.

(21) Appl. No.: 12/901,842

(22) Filed: Oct. 11, 2010

(65) Prior Publication Data

US 2011/0087517 A1 Apr. 14, 2011

Related U.S. Application Data

(60) Provisional application No. 61/250,704, filed on Oct. 12, 2009, provisional application No. 61/291,231, filed on Dec. 30, 2009.

(51) Int. Cl.
*G06Q 10/00* (2012.01)

(52) U.S. Cl.
USPC .......... 705/7.28

(58) Field of Classification Search .......... 705/7.28
See application file for complete search history.

(56) References Cited

U.S. PATENT DOCUMENTS

| | | | | |
|---|---|---|---|---|
| 4,029,952 | A | 6/1977 | Giras et al. | |
| 5,517,851 | A | 5/1996 | Berthold et al. | |
| 5,578,995 | A | 11/1996 | Bryant et al. | |
| 5,747,342 | A | 5/1998 | Zupanovich | |
| 6,195,624 | B1 | 2/2001 | Woodman et al. | |
| 6,567,795 | B2 * | 5/2003 | Alouani et al. | 706/8 |
| 7,039,555 | B2 | 5/2006 | Lang | |
| 7,113,890 | B2 | 9/2006 | Frerichs et al. | |
| 7,228,310 | B2 | 6/2007 | O'Brien | |
| 7,799,273 | B2 * | 9/2010 | Popp | 422/67 |
| 8,140,296 | B2 * | 3/2012 | Francino et al. | 702/182 |
| 2004/0225475 | A1 | 11/2004 | Johnson et al. | |
| 2004/0249517 | A1 | 12/2004 | Berwanger et al. | |
| 2004/0256718 | A1 | 12/2004 | Chandler et al. | |
| 2006/0009865 | A1 * | 1/2006 | Goldfine et al. | 700/29 |
| 2006/0271346 | A1 | 11/2006 | Lonn et al. | |
| 2006/0290935 | A1 | 12/2006 | Martin et al. | |
| 2007/0169721 | A1 | 7/2007 | Weisenstein et al. | |
| 2008/0021749 | A1 | 1/2008 | Hope | |
| 2008/0034258 | A1 * | 2/2008 | Moriya et al. | 714/57 |
| 2008/0071501 | A1 | 3/2008 | Herzog | |
| 2009/0083089 | A1 | 3/2009 | Conchieri et al. | |
| 2009/0198474 | A1 * | 8/2009 | Fritz et al. | 702/183 |
| 2011/0302921 | A1 * | 12/2011 | Ferguson et al. | 60/641.8 |

FOREIGN PATENT DOCUMENTS

| | | |
|---|---|---|
| CN | 101424397 | 5/2009 |
| WO | 2009077776 | 6/2009 |

* cited by examiner

*Primary Examiner* — Mark A Fleischer
(74) *Attorney, Agent, or Firm* — Carl M. Napolitano; GrayRobinson, P.A.

(57) ABSTRACT

An operating strategy for effectively operating a system, such as a boiler system, is provided by quantifying operation of the system based on failure characteristics modeled in a computer processor performing failure mode and effects analysis (FMEA) to forecast damage mechanisms from operational parameters. One method includes determining operational consequences from inherent damage impact of fixed operational parameters, enabling instruments for operation with the processor for monitoring and diagnosing potential damage mechanisms, forming a graphic component map sufficient for user review of preselected system locations, and developing macroscopic in-service and out-of-service condition monitoring plans for the system. Detailed condition monitoring plans are then created from the macroscopic plans by the processor classifying each damage mechanism as one of active, incipient, incidental and passive, and processing each classified damage mechanism based on industry and local historical data for providing yield indices and propensities as reference for the FMEA.

35 Claims, 11 Drawing Sheets

| REHEATER 1 SYSTEM | | |
|---|---|---|
| KEY: VT- VISUAL INSPECTION, PT- DYE PENETRANT TESTING, MT- MAGNETIC PARTICLE TEST, UT- ULTRASONIC TESTING, => INDICATES SUCCESSIVE NDE TEST REQUIRED BASED ON RESULTS OF FIRST | | |
| NO. | FAILURE LOCATION | FAILURE MECHANISM |
| 1 | PRIMARY REHEATER INLET HEADER | THERMAL-MECHANICAL FATIGUE AND VIBRATION-INDUCED FATIGUE |
| 2 | PRIMARY REHEATER TUBES | LONG-TERM OVERHEATING/CREEP |
| 3 | PRIMARY REHEATER TUBES | SHORT-TERM OVERHEATING |
| 4 | PRIMARY REHEATER TUBES | FLYASH EROSION |
| 5 | PRIMARY REHEATER TUBES | SOOTBLOWER EROSION |
| 6 | PRIMARY REHEATER TUBES | RUBBING/FRETTING |
| 7 | PRIMARY REHEATER TUBES | PITTING CORROSION |
| 8 | PRIMARY REHEATER OUTLET HEADER | THERMAL-MECHANICAL FATIGUE AND VIBRATION-INDUCED FATIGUE |
| 9 | PRIMARY REHEATER OUTLET HEADER | LONG-TERM OVERHEATING/CREEP |
| 10 | PRIMARY REHEATER OUTLET HEADER TO REHEATER ATTEMPERATOR SPRAY VALVE INLET PIPING | LONG-TERM OVERHEATING/CREEP |
| 11 | REHEATER ATTEMPERATOR SPRAY VALVE | FAILS TO OPEN |
| 12 | REHEATER ATTEMPERATOR SPRAY VALVE | FAILS TO CLOSE |
| 13 | REHEATER ATTEMPERATOR SPRAY VALVE | FAILS TO MODULATE |
| 14 | REHEATER ATTEMPERATOR SPRAY VALVE LINER | THERMAL FATIGUE |
| 15 | REHEATER ATTEMPERATOR SPRAY VALVE LINER | THERMAL-MECHANICAL FATIGUE AND VIBRATION-INDUCED FATIGUE |
| 16 | REHEATER ATTEMPERATOR SPRAY VALVE OUTLET TO SECONDARY REHEATER INLET HEADER PIPING | THERMAL FATIGUE |
| 17 | SECONDARY REHEATER INLET HEADER | THERMAL-MECHANICAL FATIGUE AND VIBRATION-INDUCED FATIGUE |
| 18 | SECONDARY REHEATER INLET HEADER | LONG-TERM OVERHEATING/CREEP |
| 19 | SECONDARY REHEATER TUBES | RUBBING/FRETTING |

FROM FIG. 6A

| REHEATER 1 SYSTEM | |
|---|---|
| KEY: VT- VISUAL INSPECTION, PT- DYE PENETRANT TESTING, MT- MAGNETIC PARTICLE TEST, UT- ULTRASONIC TESTING, => INDICATES SUCCESSIVE NDE TEST REQUIRED BASED ON RESULTS OF FIRST | |
| FAILURE CAUSE | STRATEGY |
| MOTION-INDUCED STRESS | TEMPERATURE MONITORING => UT GIRTH WELDS |
| STRESS, TIME AT TEMPERATURE | TEMPERATURE MONITORING => UT (OXIDE)=> TUBE SAMPLING |
| FLOW OBSTRUCTION | VT => RT => TUBE SAMPLING |
| FLUE GAS PARTICLE ABRASION | CAVT AND MODIFICATIONS. => MILL PERFORMANCE MONITORING, CONTROL EXCESS AIR,=> VT, UT |
| WATER AND GAS PARTICLE ENTRAINMENT IN SOOTBLOWING STEAM | PERFORMANCE MONITORING, CONDITION-DRIVEN SOOTBLOWING=> VT => UT |
| TUBE TO TUBE VIBRATIONS | VT |
| POOR LAY-UP PROCEDURES | PERFORMANCE MONITORING, ADHERE TO STRICT LAY-UP PROCEDURES=> UT =>TUBE SAMPLING |
| MOTION-INDUCED STRESS | TEMPERATURE MONITORING=> UT GIRTH WELDS, |
| STRESS, TIME AT TEMPERATURE | TEMPERATURE MONITORING=> REPLICATION ON HEADER SURFACE, UT WELDS, |
| STRESS, TIME AT TEMPERATURE | TEMPERATURE MONITORING=> REPLICATION ON PIPING SURFACE, UT WELDS, |
| VALVE MECHANISM FAILURE | VT |
| VALVE MECHANISM FAILURE | ADHERE TO STRICT LAY-UP PROCEDURES=> UT=> TUBE SAMPLING |
| VALVE MECHANISM FAILURE | TEMPERATURE MONITORING=> VT=> RT, MT, UT AND/OR PT |
| ΔT-INDUCED STRESS | VT |
| MOTION-INDUCED STRESS | VT |
| ΔT-INDUCED STRESS | TEMPERATURE MONITORING=> MT, UT AND/OR PT |
| MOTION-INDUCED STRESS | TEMPERATURE MONITORING=> UT GIRTH WELDS, |
| STRESS, TIME AT TEMPERATURE | TEMPERATURE MONITORING=> REPLICATION ON HEADER SURFACE, UT WELDS, |
| TUBE-TO-TUBE VIBRATION | VT |

FIG. 6B

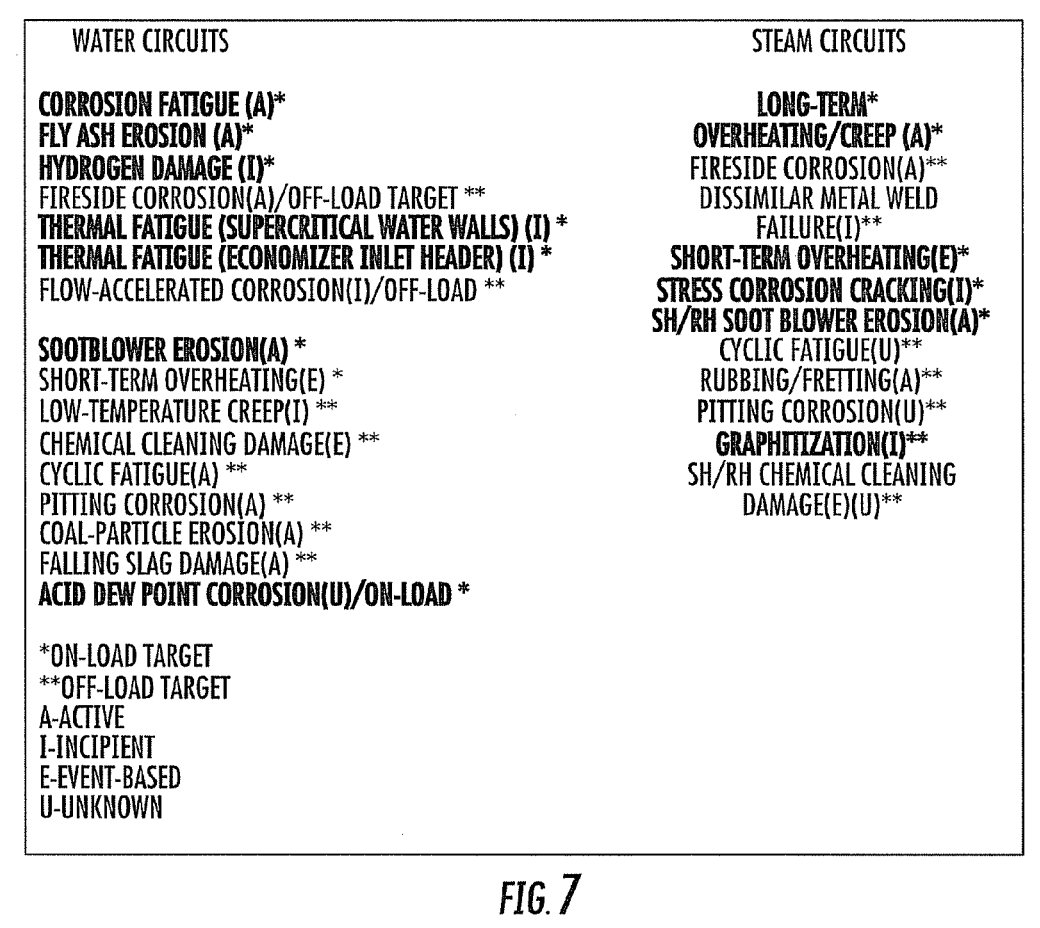

WATER CIRCUITS

CORROSION FATIGUE (A)*
FLY ASH EROSION (A)*
HYDROGEN DAMAGE (I)*
FIRESIDE CORROSION(A)/OFF-LOAD TARGET **
THERMAL FATIGUE (SUPERCRITICAL WATER WALLS) (I) *
THERMAL FATIGUE (ECONOMIZER INLET HEADER) (I) *
FLOW-ACCELERATED CORROSION(I)/OFF-LOAD **

SOOTBLOWER EROSION(A) *
SHORT-TERM OVERHEATING(E) *
LOW-TEMPERATURE CREEP(I) **
CHEMICAL CLEANING DAMAGE(E) **
CYCLIC FATIGUE(A) **
PITTING CORROSION(A) **
COAL-PARTICLE EROSION(A) **
FALLING SLAG DAMAGE(A) **
ACID DEW POINT CORROSION(U)/ON-LOAD *

STEAM CIRCUITS

LONG-TERM*
OVERHEATING/CREEP (A)*
FIRESIDE CORROSION(A)**
DISSIMILAR METAL WELD FAILURE(I)**
SHORT-TERM OVERHEATING(E)*
STRESS CORROSION CRACKING(I)*
SH/RH SOOT BLOWER EROSION(A)*
CYCLIC FATIGUE(U)**
RUBBING/FRETTING(A)**
PITTING CORROSION(U)**
GRAPHITIZATION(I)**
SH/RH CHEMICAL CLEANING DAMAGE(E)(U)**

*ON-LOAD TARGET
**OFF-LOAD TARGET
A-ACTIVE
I-INCIPIENT
E-EVENT-BASED
U-UNKNOWN

FIG. 7

FAILURE MODE TEMPLATE FOR: SHRH PITTING CORROSION
(MONITORING HEAT FLOW AND WALL TEMPERATURE IN BOILER SUPER-HEATER AND RE-HEATER TUBE BUNDLES)

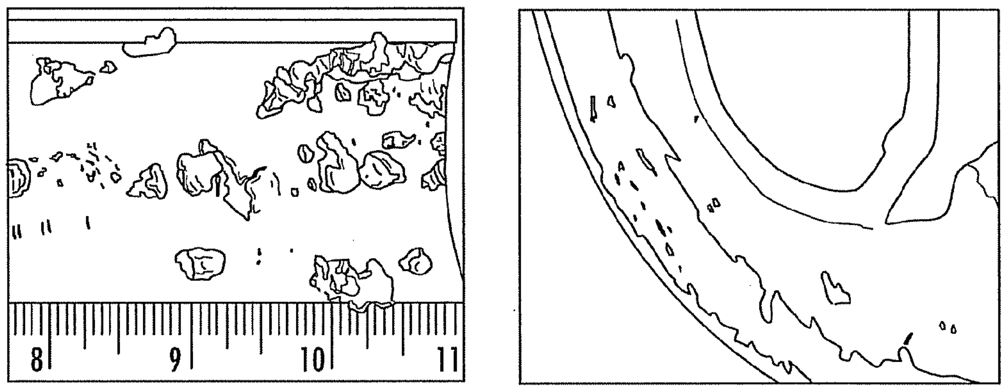

| FAILURE MECHANISM: 2 |
|---|
| PITTING IS A FORM OF DAMAGE THAT CAN OCCUR THROUGHOUT THE BOILER. ONE CAUSE OF PITTING IS THE RESULT OF POOR SHUTDOWN PRACTICES WHICH ALLOW STAGNANT, OXYGEN-SATURATED CONDENSATE TO FORM IN THE PENDANT LOOPS OR BOWED HORIZONTAL REHEATER OR SUPERHEATER TUBING. A SECOND FORM, AFFECTING PRIMARILY REHEATERS IS MECHANICAL CARRYOVER OF $Na_2SO_4$ WHICH COMBINES WITH CONDENSATE DURING SHUTDOWN TO CAUSE PITTING IN FERRITIC TUBING |
| DAMAGE CAUSE: INTRODUCTION |
| POOR SHUT DOWN PRACTICES WITH OXYGEN SATURATED STAGNANT WATER=>PITTING+HOOP STRESSES=> RUPTURE. CARRYOVER OF $Na_2SO_4$ INTO THE REHEATER=>PITTING+HOOP STRESSES=> RUPTURE. |
| DAMAGE MODE: TABLE 12-1 |
| PINHOLE DAMAGE, PITTING IN THE ID OF THE TUBE. |
| POSSIBLE ROOT CAUSE(S): 3 |
| C1 - INFLUENCE OF POOR SHUTDOWN PRACTICES (PRESENCE OF STAGNANT, OXYGENATED WATER.<br>C2 - FORCED COOLING AND/OR IMPROPER DRAINING AND VENTING PROCEDURES.<br>C3 - IMPROPER ACID CLEANING.<br>C4 - DEPOSITION OF CHEMICALS ON SUSCEPTIBLE SURFACES. |
| DAMAGE PRECURSORS: TABLE 12-3 |
| P1 - INDICATION THAT STAGNANT, OXYGENATED WATER MAY HAVE RESTED IN TUBES DURING SHUTDOWN/LAYUP PARTICULARLY IN THE ECONOMIZER AND REHEATER<br>P2 - EVIDENCE OF A SHORTCOMING DURING UNIT SHUTDOWN/LAYUP E.G. UNCERTAINTY ABOUT AIR/WATER QUALITY, INSUFFICIENT NITROGEN BLANKETING, INSUFFICIENT N2H4, EVIDENCE OF AIR-IN LEAKAGE<br>P3 - STEAMSIDE DEPOSITS IN THE RH TUBING-PARTICULARLY OF SODIUM SULFATE<br>P4 - HIGH LEVELS OF Na OR SO4 LEVELS IN THE STEAM. |

FROM 9A FROM 9A

| HOW CAN DAMAGE BE IDENTIFIED, VERIFIED AND ITS EXTENT DETERMINED?: 4 |
|---|
| UT FOR WALL LOSS, TUBE SAMPLING AND EXAMINATION FOR VERIFICATION, VT (VIDEO CAMERA) FOR EXTENT OF DAMAGE. DIFFICULT UNLESS WIDESPREAD WITH SIGNIFICANT WALL LOSS COMPOUNDED BY ACCESS AND SURFACE PREPARATION. |
| WHERE DOES DAMAGE NORMALLY OCCUR?: 1.2 OR TABLE 12-1 |
| THROUGHOUT THE BOILER WHERE WATER STAGNATES IN TUBES DURING SHUTDOWN OR LAYUP PERIODS. BOTTOMS OF FERRITIC PENDANT LOOPS OF THE SUPERHEATER AND REHEATER TUBING AND LOW POINTS OF SAGGING FERRITIC HORIZONTAL TUBES. |
| DAMAGE FEATURES: TABLE 12-1 |
| PITTING IS LOCALIZED PART OR THROUGH WALL |
| INSPECTION FEATURES: 2.1 |
| PINHOLE DAMAGE, PITTING IN THE ID OF THE TUBES. 3 TO 9 O'CLOCK POSITION |
| WHAT MATERIALS ARE NORMALLY SUBJECT TO DAMAGE?: |
| ASME SECTION 1 CARBON MOLYBDENUM (SA-209 T1, SA209 T1a), CHROME MOLYBDENUM (SA-213 T11, SA-213 T22) AND STAINLESS STEEL (SA-213 321H, SA-213 347H, SA-313 304H) TUBES |
| WHAT IS THE UNIT STATUS WHEN DAMAGE BEGINS? |
| OUT OF SERVICE |
| DEFINITIONS: |
| FAILURE: ANY CHANGE IN A COMPONENT THAT CAUSES IT TO BE UNABLE TO PERFORM IT'S INTENDED FUNCTION<br>DAMAGE: ANY CHANGE IMPOSED UPON A COMPONENT THAT SUBSTANTIALLY REDUCES ITS USEFUL LIFE PRIOR TO FAILURE<br>DAMAGE MODE: THE APPEARANCE, MANNER OR FORM WHICH ADVANCED COMPONENT DAMAGE ULTIMATELY MANIFESTS ITSELF.<br>DAMAGE MECHANISM: HOW AND OR WHY DAMAGE OCCURS IN A CHEMICAL OF METALLURGICAL TERMS<br>DAMAGE CAUSE: THE CAUSE OF A DAMAGE EVENT OR DAMAGE MODE |
| REFERENCES: BOILER TUBE FAILURES: THEORY AND PRACTICE, NAUGHTON, DOOLEY 1996, THE NALCO GUIDE TO BOILER FAILURE ANALYSIS, PORT, HERRO 1991, METALLURGICAL FAILURES IN FOSSIL FIRED BOILERS, FRENCH 1993, MINERAL IMPURITIES IN COAL COMBUSTION, RAASK 1985 |

FIG. 9B

TARGETED EQUIPMENT MONITORING SYSTEM AND METHOD FOR OPTIMIZING EQUIPMENT RELIABILITY

CROSS-REFERENCE TO RELATED APPLICATIONS

This application claims the benefit of U.S. Provisional Application No. 61/250,704 for Targeted Equipment Component Operating System and Method for Avoiding Equipment Failure, having filing date Oct. 12, 2009 and U.S. Provisional Application No. 61/291,231 for System and Method for Safely and Economically Operating a Boiler, having filing date Dec. 30, 2009, the disclosures of which are hereby incorporated by reference herein in their entirety and all commonly owned.

FIELD OF THE INVENTION

The present invention generally relates to mechanical equipment operations and failures, such as tube failures in power generation equipment, and more particularly to systems and methods for reducing and substantially eliminating mechanical equipment failures through targeted component condition monitoring and modified operation of the equipment as a failure defense.

BACKGROUND OF THE INVENTION

It is well known that fossil and nuclear power production equipment require metallurgical heat exchange components, specifically boilers, operating in harsh environments at very high temperatures and pressures, to run safely and reliably for extended periods of time, sometimes many years without scheduled equipment overhauls. By way of example, one of the most difficult of these is the large coal-fired fossil boiler.

While such examples are herein addressed, it is well known to those of ordinary skill in the art that fossil boilers, although major, make up only part of a typical reheat regenerative Rankin cycle. Further, tube failures constitute one of the industry's principle reasons for high equipment downtime and costs.

Systems and methods for managing equipment operations and addressing equipment failures are well known. By way of example, US utility patent application publication, US 2007/0169721 for Weisenstein et al. discloses online boiler tube degradation monitoring with optimization software. One disclosed method includes monitoring a degradation of steam generator boiler tubes in large combustion facilities, wherein the boiler tubes are arranged in a flue gas tract and exposed to flue gases from a combustion process. The method comprises receiving and evaluating signals indicative of a degradation of the boiler tubes from within the flue gas tract while steam is being generated. Additional features include receiving signals by degradation sensors located external to the flue gas tract, receiving ultrasonic signals by ultrasonic transducers, and receiving the signals from a test tube arranged in the flue gas tract and being exposed to the flue gases.

By way of further example, U.S. Pat. No. 7,113,890 to Frerichs et al. discloses predictive tube failure in a boiler. One disclosed method detects a fault in a component of a continuous process in a steam generator system. The method includes developing a model of the continuous process, generating predicted values for a predetermined number of operating parameters of the continuous process using the model, comparing the value predicted by the model for each of the predetermined number of operating parameters to a corresponding actual measured value for the operating parameter, and determining whether differences between the predicted and actual measured values for one or more of the predetermined number of operating parameters exceeds a configured statistical limit using Statistical Process Control (SPC) methods. The predetermined number of operating parameters of a continuous process depends on the process and is on a water/steam side of a boiler/turbine power cycle. Predetermined parameters may include make-up flow, feed water flow and condensate flow.

Yet further, U.S. Pat. No. 6,567,795 to Alouani et al. also discloses predictive tube failure in a boiler. Nevertheless, mechanical equipment failures remain a major cause of forced outages for fossil-fueled steam generators.

By way of example of a need in the industry, consider a boiler pressure part system owner tasked with coming up with a program to eliminate boiler tube failures. The first thing the owner must do is to collect and compile data for use in building the test & inspection plan. Because it is less labor intensive and because the operators responsible for the boiler are new, it is decided that the plan must make extensive use of computerized technology. There are challenges that stand in the way of developing a good plan that must be overcome.

By way of example, challenges may include Challenge #1: The inability to analyze the influences that off-design fuel, water chemistry and negative useful life influences (hours of operation, stress/fatigue cycles, thermal cycles, etc.) the equipment is exposed to as part of day to day operation that can be manifested as damage.

Challenge #2: The boiler is large, its operating environment is extremely harsh and the problems complicated. The boiler is built with several hundred miles of heat transfer tubing and piping. Scientists have identified over thirty damage mechanisms that threaten the boilers ability to contain and circulate water to produce steam at thousands of pounds of pressure and at high temperatures. As will be seen, the present invention provides enhances a thorough understanding of the behavior of these mechanisms by dividing the boiler into smaller, more manageable pieces so that care strategies and plans, unique to each part can be designed, implemented and executed with support from available computerized information management systems.

Challenge #3: It would make sense to harness the analogue and digital data streams used by the units' computerized digital control system (DCS) and other in-service component condition monitoring software for several reasons. However obstacles must be overcome that may include when the generating unit is running well, there are long periods of time between shut-downs. This means that acquiring data necessary for trending component deterioration while the unit is down, are few and far between. There is very little time to get the data aforementioned. It is normal for units capable of producing electricity inexpensively to be returned to service as soon as possible; and power producers have reduced their operations and maintenance budgets and workforce significantly due to pressures from Wall Street and because they were lead to believe that a computer can do the tasks automatically that were once done manually. This has not panned out. In the past several years, much of the workforce expertise, that was able to deductively interpret the meaning of unit condition indications then take intelligent and timely action, has retired. Young, very capable people have replaced them but the experience is sorely missed when faced with unusual conditions. There is more data coming from the DCS's data acquisition systems than people typically have time to analyze. This diminishes the value of the investment in the data acquisition system. In addition, there is a Challenge #4 that many boilers lack the appropriate instrumentation that would enable maximized monitoring and diagnostics. Installing instrumentation is capital intensive and sometimes difficult to justify. In hindsight, if points required for condition and diagnostics had been understood, many power producers that have recently upgraded the control systems to DCS, could have absorbed most of the cost of new sensors, within the DCS upgrade project budget.

The present invention addresses such challenges.

SUMMARY

In view of the foregoing background, the present invention is directed to systems and methods of reducing and substantially eliminating mechanical equipment failures such as boiler tube failures, by way of example. One embodiment of the invention is herein described as a Targeted Boiler Management (TBM), but as will come to the mind of those skilled in the art, any appropriate operating equipment, and thus other names or acronym may be applied.

Embodiments of the invention may use tube and header failure modes, causes, and mechanisms to organize mitigation and prevention tasks to eliminate or substantially reduce equipment failure through proactive and predictive component condition monitoring plans. Being proactive prevents the onset of new damage and being predictive slows the propagation of existing damage. Failure defense philosophies and strategies may be established using a TBM analytical engine that prompts the user of the equipment, the benefactor, to provide particular fixed and variable inputs to produce tailored reliability schemes. Failure mode and effects analysis is employed, as well as equipment inspections and monitoring, Embodiments of the invention as herein described are directed to the TBM systems and methods that may comprise one or a combination of the following applications, processes and support tools.

Software, an analytical software engine as herein described, may be operated using fixed unit operating data to establish a potential future impact of current, non-designated operating parameters (fuel, cycle water chemistry, etc.) and current component-specific remaining useful equipment life inputs (time at temperature, duty cycles, etc.), herein refereed to as conditionals.

Failure modes and effects analysis (FMEA) or similar analysis is employed to analyze, catalogue, organize and align heat exchange component condition monitoring tasks with their respective failure/damage modes, mechanisms and causes. FMEA outputs in conjunction with the "conditional" outputs from the analytical engine may then be used to construct component-specific in-service and out-of-service test and inspection standards as well as operational care strategies based on all existing and incipient damage threats.

A quantitative risk model enables high-probability and high consequence component sections/areas/locations with known or incipient deficiencies to be targeted for stepped up surveillance both in-service as well as during forced and planned unit outages.

A diagnostic software engine may be used with select high-resolution, streamed "raw" process data, that is quality-checked and mathematically converted into meaningful "condition" inputs to feed logic-based rules that, when conditions are deemed abnormal "push" action recommendations with a confidence level (based on signal quality) to an end user for evaluation/timely corrective measures.

Yet further, refined and embedded work processes enable optimal and sustained application of embodiments of the invention.

One method aspect of the invention may include quantifying an operation of a system based on failure characteristics modeled in a computer having data storage coupled to a processor performing failure mode and effects analysis (FMEA) to forecast damage mechanisms from operational parameters for defense plan and strategy development to effectively operating the system. One embodiment may comprise determining operational consequences by extracting and characterizing an inherent damage impact from fixed operational parameters, enabling instruments for communicating with the processor for monitoring and diagnosing potential damage mechanisms, monitoring and diagnosing potential damage mechanisms by the processor, forming a graphic component map sufficient for user review of preselected system locations, developing macroscopic in-service and out-of-service condition monitoring plans for the system, and creating detailed condition monitoring plans from the macroscopic plans by the processor classifying each damage mechanism as one of active, incipient, incidental and passive, and processing each classified damage mechanism based on industry and local historical data for providing yield indices and propensities as reference for the FMEA.

A method may include monitoring and diagnosing potential damage mechanisms by the processor by identifying at least one failure mode of the system, determining a cause for the at least one failure mode and establishing a failure mechanism, determining a precursor for the failure mechanism by characterizing damaging influences, determining operating conditions of the system for measuring the precursor, measuring the precursor through the monitoring step, and determining whether the precursor measuring is appropriate for in-service or out-of service monitoring.

Determining an operational consequence may include determining potentially detrimental properties of impurities in a material operable with the system, extracting a number of operating hours for each major component for determining a remaining useful life for the major component, extracting a number of hot and cold starts in thermal cycles per major component for determining a potential for thermal fatigue of the system, extracting and mapping a mode of operation over time for determining a potential for mechanical fatigue, and determining a potentially detrimental damage from upsets in cycle water treatment.

Instruments may be enabled by transferring instrument input and output data to the data storage, sorting the instrument signals by subsystem and component, modeling an ideal subsystem and component condition, modeling at least one of a plurality of actual and a plurality of potential damage mechanisms for the system and components thereof, analyzing existing instruments and the plurality of damage mechanisms for determining a need for providing additional instrumentation, performing an economic analysis to justify procurement of the additional instrumentation, repairing non-functioning yet essential condition-monitoring instruments, installing and testing the condition-monitoring instruments, and transmitting instrument output signals to an in-service condition monitoring data acquisition system.

A graphic component map may be formed using an alphanumeric character string to enable electronic linking of existing, in-house data management software applications to in-service and out-of-service condition monitoring plans and strategies, wherein the in-house data management software applications comprises at least one of a computerized maintenance management system, an out-of-service periodic inspection data management system, and an in-service continuous data management system. This map forming may include defining boundaries for subsystems and components, assigning equipment identification numbers (EIN) and descriptions sufficient computerized maintenance management system (CMMS) use, creating unit-specific tube and header computer aided design (CAD) diagrams, transferring the CAD diagrams to an alternative graphic software application, diagramming inspection area boundaries based on potential damage mechanisms and stationary references both inside and outside of the system, creating parent-child component and sub-component alpha-numeric character strings for providing area inspection numbers (AIN) and associate an existing EIN with plans and strategies, assigning the AIN following a steam and water flow path sequence, wherein lower AIN are nearer to a subsystem inlet and higher AIN are closer to a subsystem outlet, or transferring the AIN to the data storage.

In-service and out-of-service condition monitoring plans may be developed using a consolidated targeted system management template to serve as a system inspection guideline. Developing the plans may include methodically following system operations component by component and area by area or assigning potential damage mechanisms, failure modes, failure causes and appropriate on and out-of-service mitigation strategies.

Creating a detailed condition monitoring plan may include defining current active damage mechanisms and mitigation plans, collecting site-specific engineer and inspector knowledge for a task benchmarking, reliability risk ranking, and prioritization (TB&RP) processing, establishing a baseline for at least one of mean time to repair (MTTR), mean time to inspect (MTTI) and mean time between failures (MTBF) from event timelines for mapping potential failures, examining existing system failure root-cause analysis results to extract, map, validate and document failure causes, mechanisms, modes and locations, incorporating operational consequences and map vulnerable areas resulting from the determining operational consequences determining step through use of the processor, or mapping the instruments identified in the instruments enabling step to physical boiler locations.

Defining incipient damage mechanisms and mitigation plans may include compiling non-site-specific industry damage/failure data from at least one of similar system units in a fleet of systems, from OEM technical publications and from industry databases, compiling data from past inspection reports for the system, compiling data from a current system inspection program for the system, compiling capital replacement program and timeline data, compiling component modification history for the system, or transcribing mapped data to appropriate areas on condition monitoring plans and strategies.

Collecting site-specific engineer and inspector knowledge for a task benchmarking, reliability risk ranking, and prioritization (TB&RP) processing may include laminating current system elevation diagrams to serve as damage maps, mapping damage locations, mapping damage types, extracting root-cause opinions, mapping modification locations, or transcribing the mapped data to appropriate areas on condition monitoring plans and strategies.

Examining existing system failure root-cause analysis reports may be employed to extract, map and document failure causes, mechanisms, modes and locations and may include processing metallurgical evaluations and chemical analyses and auditing a type of and progress on corrective resolutions identified to an address root-cause, and identifying resolved root-causes as inactive. The process may comprise determining which damage mechanisms are candidates for an in-service condition monitoring through the processor and which are not candidates and handled through out-of-service testing and inspecting, or further include ranking risks and prioritizing tasks.

One embodiment of the invention includes a processor having means for calculating risk parameters including repair time, cost and availability consequence for each identified failure, the processor combining condition monitoring outputs for failure probabilities for quantifying the risk to support decision-making, the processor further determining criticality for economic/budgetary prioritization of recommended protection schemes for all the identified failure scenarios based on benefit-to-cost.

As herein described below by way of example, one method aspect of the invention may comprise quantifying operation of a boiler based on failure characteristics modeled in a computer having data storage coupled to a processor performing failure mode and effects analysis (FMEA) to forecast damage mechanisms from operational parameters for defense plan and strategy development in effectively operating the boiler. This may further comprise determining potentially detrimental properties of impurities in a fuel operable with the boiler, extracting a number of hot and cold starts in thermal cycles per major component for determining a potential for thermal fatigue, and determining a potentially detrimental damage from upsets in cycle water treatment.

Consider the needs expressed above for the boiler owner. As will be seen through the description and examples described below, solutions are provided for such challenges.

By way of example, Solution to #1: The solution is an analytical software "engine" utilizing inputs of specific sets of fixed and variable data that, through standard mathematical calculations, yields the relative probability and definition of damage to be expected to boiler components, operating under these conditions. This application would lay enable preliminary understanding and mapping of corresponding incipient and active damage in boiler care plans and strategies.

Solution to #2: The solution is a system that utilizes area-specific alpha/numeric strings that couple existing equipment identification nomenclature in the CMMS with the associated test and inspection strategies for easy management of the unusual volumes of data that will result and clear inter-departmental communications when actions are requested in a particular area.

Solution to #3: The solution is a software application that not only monitors component conditions, but carries out diagnoses of sensed anomalies to the extent possible so people are less burdened. A software application may take continuously streamed data (static and dynamic steam or gas pressures, flows, temperatures, draft) from the DCS data acquisition system, grouped logically by precursors that can lead to each of many damage mechanisms, then filter it in order to "flag" signal anomalies, correct the data for unit load conditions to assure relativity and repeatability, convert it to more useful condition indicators ($\Delta T$, $\Delta P$, etc.), send the condition indications to a "smart" Boolean rule base that contains logic-based rules written to alert the end user (operator, system owner, plant manager, etc.) when a precursor or precursors exist that are out of acceptable range to mimic creation of damage. This yields monitoring and diagnoses of impending damage with reasonable likelihood (Time out of compliance) and type (complex data variations/combinations of damage to be expected to boiler components by operating under these circumstances as a first step to understanding and mapping potentially active damage that would result.

Solution to #4: The solution is condition monitoring and diagnostic modeling to form the foundation for economic justification for new instrument additions and existing instrumentation refurbishment. Computer models may align instrument requirements needed for on-line, proactive mitigation of all known and incipient component-specific damage mechanisms. This would tie the on-load component condition monitoring plan and strategy directly to the negative reliability, O&M and capital replacement cost impacts for use in justifying expenditures for hardware installation through the ability to construct cost to benefit, point of net value and breakeven relationships. Seeming apparent, this practice is limited or non-existent because of the absence of a "big picture", component-specific boiler tube and header failure and outage extension plan and strategy. Once the instrumentation needs are identified and satisfied, the signals will feed additional rules to cover proactive diagnostics outlined in Solution #3.

BRIEF DESCRIPTION OF THE DRAWINGS

For a fuller understanding of the invention, reference is made to the following detailed description, taken in connection with the accompanying drawings illustrating various embodiments of the present invention, in which:

FIGS. 6A and 6B form a table illustrating a results template from an FMEA identifying failure locations, mechanisms, cause and strategies for resolution;

FIG. 7 is a table illustrating a targeting of mechanisms to be mitigated either in an on-load or off-load test and inspection plans and strategies employed by the preset invention by way of example;

FIGS. 9A and 9B illustrate one consolidated targeted boiler management template serving as a boiler inspection guideline.

DETAILED DESCRIPTION OF EMBODIMENTS

Figure 1:
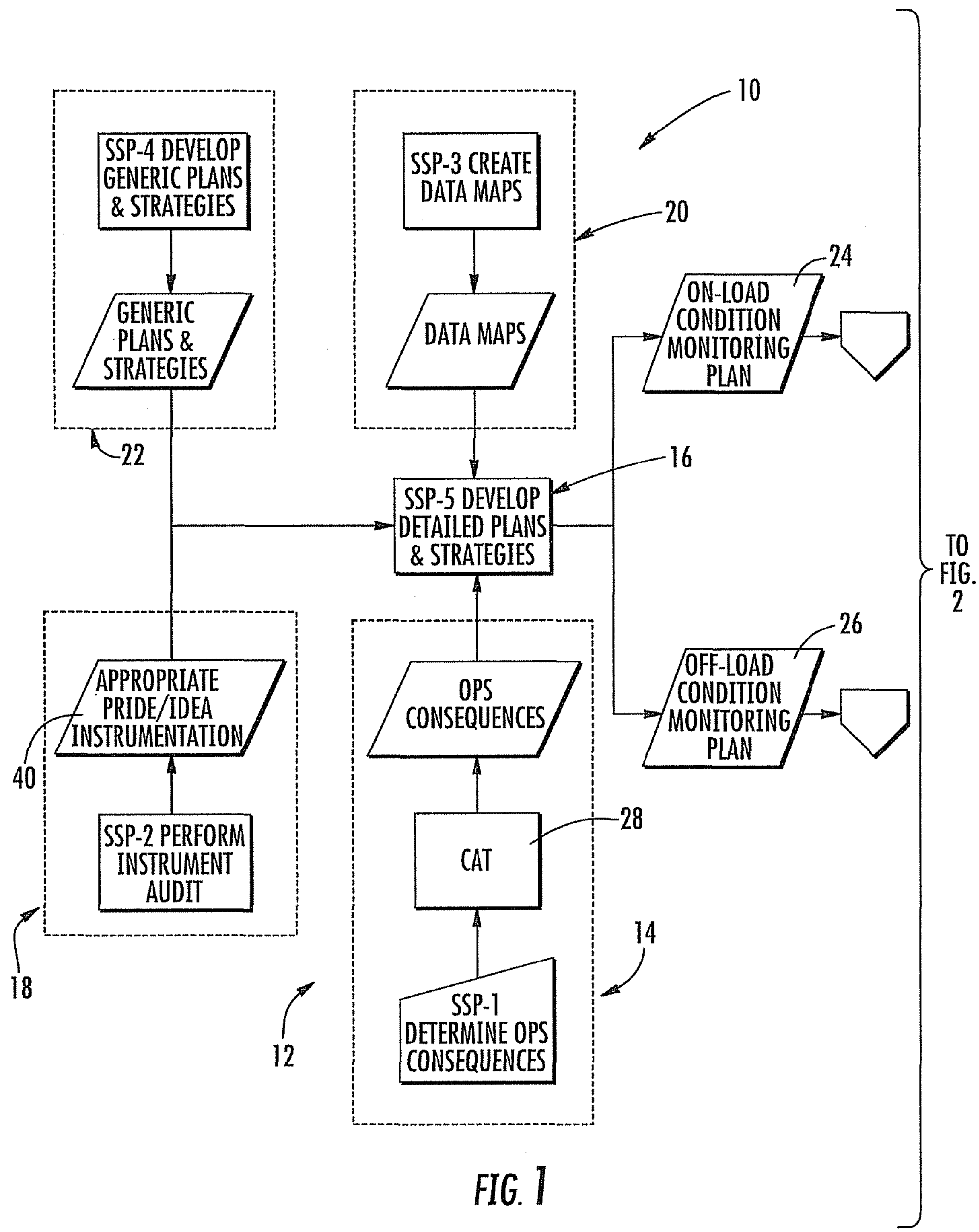
FIG. 1 is a process flow diagram illustrating one development of test and inspection plans an strategies and a functionality of one system and method for quantifying operation of a boiler according to the teachings of the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

One embodiment of the invention is herein described, by way of example, with reference to a targeted boiler management (TBM), but as above described those of skill in the art will appreciate use of the invention for other operating systems. As illustrated initially with reference to FIG. 1, one system 10 is described for quantifying operation of a boiler based on failure characteristics modeled in a computer having data storage coupled to a processor performing failure mode and effects analysis (FMEA) to forecast damage mechanisms from operational parameters for defense plan and strategy development in effectively operating the boiler. With continued reference to FIG. 1, a processor 12 includes means 14 for determining operational consequences by extracting and characterizing an inherent damage impact from fixed operational parameters. Data resulting from this processing is fed to a FMEA processor, herein described as a development plan and strategy process 16. Instruments are enabled 18 for communicating with the processor for operating for monitoring and diagnosing potential damage mechanisms. Data resulting from this step 18 are also transmitted to the FMEA processor operation 16. The processor further functions for monitoring and diagnosing potential and existing damage mechanisms 20 and forms a graphic component map 22 sufficient for user review of preselected boiler locations. A macroscopic template is developed and used to begin a test and inspection plan (T&IP). Such A microscopic/detailed in-service (on-load) condition monitoring plan 24 and a microscopic/detailed out-of-service (off-load) condition monitoring plan 26 for the boiler are then developed. Determination of which damage mechanisms are candidates for an in-service condition monitoring through the processor and which are not candidates and handled through out-of-service testing and inspecting is addressed in step 18. The creation of detailed condition monitoring plans from the macroscopic plans by the processor classifies each damage mechanism as one of active, incipient, incidental and passive, and processes each classified damage mechanism based on industry and local historical data to provide yield indices and propensities as reference for use in the FMEA 16.

The monitoring and diagnosing of potential damage mechanisms by the processor comprises identifying at least one failure mode, determining a cause for the one failure mode and establishing a failure mechanism, determining a precursor for the failure mechanism by characterizing damaging influences, determining boiler operating conditions for measuring the precursor, measuring the precursor through the monitoring step, and determining whether the precursor measuring is appropriate for in-service 24 or is better suited for out-of service 26 monitoring.

For one embodiment of the invention, by way of example for a boiler, determining adverse operational consequences 14 includes steps to determine consequential physical and inherent damage caused by boiler operations. This is done by defining which damage mechanisms are caused by physical influences of time, thermal cycles and temperature on material metallurgy, inherent water chemical control characteristics and post-combustion fuel impurities. By way of example for a boiler, steps included in such a process may include a) determining potentially detrimental properties of impurities in a fuel operable within the boiler; b) extracting a number of operating hours for each major component for determining a remaining useful life for the major component; c) extracting a number of hot and cold starts in thermal cycles per major component for determining a potential for thermal fatigue; d) extracting and mapping a mode of operation over time for determining a potential for mechanical or vibration induces (cyclic) fatigue; and e) determining a potentially detrimental damage from upsets in cycle water treatment.

Determining the potentially detrimental properties may comprise a) determining deposition and slagging characteristics; b) determining fuel and flue gas erosion characteristics; c) determining post-combustion corrosion characteristics, or a combination thereof.

By way of further example, determining the deposition and slagging may comprise a) characterizing features of a firebox, superheater, reheater and economizer based on an ash composition; b) determining BTU content of the fuel; c) determining ash discharge proportions; d) determining fuel mixing compared to the slagging characteristics; e) determining an acid to base oxide ratio; f) determining an ash fusion temperature; g) determining a pyritic iron content, or a combination thereof.

Determining the fuel and flue gas erosion characteristics may comprise a) determining boiler firebox dimensions, gas lane spacing, and tubing materials based on a combustion gas velocity parameter; b) determining a calorific value of the fuel; c) determining a hardness the ash; d) determining an average ash particle size distribution and ash quartz content; e) determining a pyretic iron content; determining a silica ratio, or a combination thereof.

Determining the post-combustion corrosion characteristics may comprise a) determining a layout of firebox, superheater, reheater and economizer based on ash characteristics and composition; b) determining theoretical gas and tube metal surface temperatures; c) determining a composition of the tubes protective oxide layer; d) determining a makeup of flame-volatized deposits in the ash; e) performing an historic review and noting areas susceptible to reducing atmospheres, or a combination thereof.

Determining the potentially detrimental damage may comprise a) extracting a feedwater chemistry control regime; b) auditing a feedwater chemistry analysis equipment calibration; c) auditing feedwater chemistry analysis equipment for consideration in a monitoring and diagnostic scheme; d) extracting feedwater chemistry control limits; e) extracting feedwater chemistry sampling routines; f) auditing control compliance and measuring a timeframe of upsets, or a combination thereof.

It will be understood by those of ordinary skill in the art that determining the operational consequences may be useful for Pulverized Coal-Fired Boilers, Cyclone Coal-Fired Boilers, Oil-Fired Boilers, Oil-to-Coal Converted Boilers, and other equipment operating with similar or related functionality. As above addressed, determining consequential physical and inherent damage caused by boiler operations may be performed by defining which damage mechanisms are caused by physical influences of time, thermal cycles and temperature on material metallurgy, inherent water chemical control characteristics and post-combustion fuel impurities. By way of further example, the following procedures are herein presented designating targeted damage mechanisms (TDM).

Coal Properties may first be considered as organized in the following Table 1.

TABLE 1

| | Caloric | Wt. % | | | | | |
|---|---|---|---|---|---|---|---|
| Coal Rank | Value (MJ kg$^{-1}$) | Volatile Matter | Total Carbon | Fixed Carbon | Hydrogen | Oxygen | Bed Moisture |
| Unconsolidated Lignite | 24-25 | 50-55 | 59-68 | 45-50 | | 20-25 | 35-50 |
| Consolidated Lignite | 25-30 | 45-50 | 68-75 | 50-55 | | 20-25 | 20-35 |
| Sub-Bituminous | 30-32 | 40-45 | 75-80 | 55-60 | 4.5-5.5 | 15-20 | 8-10 |
| Bituminous 1 | 33-36 | 32-40 | 80-84 | 60-68 | 5-5.8 | 5-10 | 2.5-5 |
| Bituminous 2 | 36-37 | 26-32 | 84-87 | 68-74 | 5-5.8 | 2.5-5 | 2.5-5 |
| Bituminous 3 | 37-39 | 22-26 | 87-89 | 74-78 | 4.5-5.5 | 2.5-5 | 1.0-2.5 |
| Bituminous 4 | 39-40 | 18-22 | 89-91 | 78-82 | 4.0-4.5 | 2.5-5 | 0.8-1.0 |
| Carbonaceous | 38-40 | 10-18 | 91-93 | 82-90 | 2.5-4 | 2.5 | 1.0-1.5 |
| Anthracite | 37-39 | 8-10 | 93-95 | 90-92 | 2.5 | 2.5 | 1.5-2.5 |

An algorithm operable with the processor 12 may then be set up to calculate weight percentages of bottom, clinker and fly ash (Laboratory-generated ash samples) as follows:

$$A_b=A[x(1-0.5SO_{3l}-0.05Fe_2O_{3l}+C_b)+(1-x)(1-0.2SO_{3l}-0.05Fe_2O_{3l})]$$

wherein $A_b$=Total laboratory derived ash (wt. %)

X=Fly Ash (wt. %)

1−X=Clinker Ash (wt. %)

$A_{bc}$=Bottom Ash=A $(1-0.2SO_{3l}-0.05Fe_2O_{3l})$ (wt. %)

$SO_{3l}$=laboratory derived $SO_3$ content (wt. %)

$Fe_2O_{3l}$=laboratory derived $Fe_20_3$ (wt. %)

$C_b$=Unburned carbon (wt. %)

Coal combustion characteristics are based on mineralogical properties and may have the following damage mechanisms, by way of example:

Fly Ash Erosion as the TDM

Erosion index (Impingement or cutting wear causing reduction in tube wall thickness—fly ash erosion)

From analysis of silica and quartz content in ash, the following characteristics are determined as illustrated in the following Table 2:

TABLE 2

| Erosion Propensity | SiO2 Content (wt. %) | Erosion Index |
|---|---|---|
| Low | <40 | <0.02 |
| Medium | 40-50 | 0.02-0.08 |
| Medium-High | 50-60 | 0.04-0.28 |

From particle size analysis of flame-heated ash; burned ash sample of typical coal, size-fractioned and analyzed for quartz content, the following index may be calculated: $Ia=\{X_1(L_1+0.4)+X_2(0.5L_2+0.2)\}I_{1q}$ wherein Ia=Abrasive index of ash $X_1$ and $X_2$=weight fraction of >45 μm and 5-45 μm quartz size cuts $I_1q$=>45μ-size quartz particles As is well known to those of ordinary skill in the art, such a formula accounts for abrasion due to silica particles and quartz particles where $I_1g=0.4\ I_1q$. Characteristics may be addressed as in Table 3, by way of example.

TABLE 3

| Erosion Propensity | Particle Diameter (μm) | Relative Erosion Index | Erosion Index |
|---|---|---|---|
| Low | <5 | 0 | <0.02 |
| Medium | 5-45 | 0.5I□a | 0.02-0.08 |
| Medium-High | >45 | I□a | 0.04-0.28 |

Coal Mill Wear as the TDM

Abrasion index (relates to sliding surface wear of auxiliary equipment in flow path by fly ash (1) and raw coal (2)—fly ash erosion, coarse fuel grind from milling plant From particle size analysis of flame-heated ash; burned ash sample of typical coal, size-fractioned and analyzed for quartz content $$Ia=\{X_1(L_1+0.4)+X_2(0.5L_2+0.2)\}I_{1q}$$

Ia=Abrasive index of ash $X_1$ and $X_2$=weight fraction of >45 μm and 5-45 μm quartz size cuts $I_1q$=>45μ-size quartz particles This formula accounts for abrasion due to silica particles and quartz particles where $I_1g=0.4I_1q$. Characteristics may be addressed as in Table 4.

TABLE 4

| Abrasiveness | Particle Diameter (μm) | Relative Abrasive Index | Abrasive Index |
|---|---|---|---|
| Low | <5 | 0 | <0.02 |
| Medium | 5-45 | 0.5I1a | 0.02-0.08 |
| Medium-High | >45 | I1a | 0.04-0.28 |

From analysis of mineral species in coal; raw coal sample of typical coal, mineral species focused on quartz and pyrite content $$Ic=(Cq+xCp)Iq$$

Ic=Abrasive index of coal

Cq and Cp=weight fractions of quartz and pyrite respectively

X=relative abrasiveness of coal pyrites and quartz=Ip=(0.2 to 0.5)Iq=

0.2 to 0.5 depending on coal

TABLE 5

| Abrasiveness | Abrasive Index ((Cq + xCp)Iq) |
|---|---|
| Minimal | 0.01 |
| Moderate | 0.01-0.025 |
| High | 0.025-0.05 |
| Exceptionally High | >0.05 |

Slag Fall Damage, Sootblower Erosion, Long-Term Overheating, and Fly Ash Erosion as the TDM Sintering, sintering rate, Sintering is ash depositing on heat exchange surfaces in the combustion zone.

Combination Silica Ratio and Iron Oxide Content Comparison $$\text{Silica Ratio} = R_{Si} = \frac{SiO2 \times 100}{SiO2 + Fe2O3 + CaO = MgO}$$

$$\text{Iron Oxide} = Fe2O3\ (\text{wt. }\%)$$

TABLE 6

| Classification of Ash | Iron Oxide (wt. %) | Silica Ratio | Slow Sintering Temp (K.) | Rapid Sintering Temp (K.) | Slagging Temp. (K.) |
|---|---|---|---|---|---|
| No slagging | 3-8 | 72-80 | 1350-1450 | 11450-1550 | 1550-1700 |
| Some slagging | 8-15 | 65-72 | 1250-1350 | 1350-1450 | 1450-1600 |
| High slagging | 15-23 | 50-65 | 1150-1250 | 1250-1350 | 1350-1500 |

* Applies to coal ash with Na2O <2.5 wt. % or CaO <7.5 wt. %

$$\text{Ratio of acidic to basic oxides} = R_{b/a} = \frac{Fe2O3 + CaO + MgO + K2O + Na2O}{SiO2 + Al2O + TiO2}$$

Use $R_{b/a}$ to recommend boiler design specifying bituminous coals

TABLE 7

| Application | $R_{b/a}$ |
|---|---|
| PC Boilers | ≦.5 |
| Cyclone Boilers | ≧.27 |

* Applies to US bituminous coals

Fouling propensity of ash based on base-acid ration and sodium content. Total ($F_y$) and water-soluble ($F_{y'}$) Sodium content:

$F_y=R_{b/a}X\ Na2O$ $F_{y'}=X\ (Na2O)_{ws}$

TABLE 8

| Boiler Fouling | $F_y$ | $F_{y'}$ |
|---|---|---|
| Low | <0.2 | <0.1 |
| Medium | 0.2-0.5 | 0.1-0.25 |
| High | 0.5-1.0 | 0.25-0.7 |
| Severe | >1.0 | >0.7 |

* Applies to US bituminous coals

Fouling Index $F_x$=0.38 Na2O+0.0006 SiO2−0.008 CaO+0.062 Ash+0.0037

Use $F_x$ to determine fouling index for western coals influenced by sodium content

TABLE 9

| Boiler Fouling | Sodium (Na2O) |
|---|---|
| Slight | <0.3 (<2.5% of ash) |
| Moderate | 0.3-0.5 (2.5-4.0% of ash) |
| Severe | >0.5 (>4.0% of ash) |

* Applies to western US sub-bituminous coals

Slagging as the TDM,

Severe slagging can be caused by coal ash rich in iron or, in some sub-bituminous coal, rich in sodium.

Slagging propensity versus critical temperature (Laboratory derived)

$$F_s = \frac{4IT + HT}{5}$$

IT=Initial deformation temperature

HT=hemisphere temperature

TABLE 10

| Slagging Propensity | Slagging Index ($F_s$) Temperature (K.) |
|---|---|
| Medium | 1505-1615 |
| High | 1325-1505 |
| Severe | <1325 |

Slagging index of coal ashes from base-acid ratio and sulfur content ($F_{s'}$)

$F_{s'}=R_{b/a}$ X S

TABLE 11

| Boiler Slagging | Slagging Index ($F_{s'}$) |
|---|---|
| Low | <0.6 |
| Medium | 0.6-2.0 |
| High | 2.0-2.6 |
| Severe | >2.6 |

Fly Ash Erosion and Sootblower Erosion as the TDM

Fouling is defined as a build-up of bonded and sintered deposits on superheater and reheater tubes in the convective heat transfer passages of a boiler. Gas temperatures in these sections are usually <1350 K (too low for slag formation).

Ash rich in Ca and Na can cause severe fouling

Ash fouling propensity based on sodium and chlorine content of coal

TABLE 12

| Boiler Fouling | Sodium ($Na_2O_3$) Content (wt. %) | Chlorine (Cl) Content (wt. %) |
|---|---|---|
| Slight | <2.5 | <0.3 |
| Moderate | 2.5-4.0 | 0.3-0.5 |
| Severe | >4.0 | >0.5 |

Deposit-forming propensity of bituminous and Lignitic ash based on sodium content.

For Bituminous type ash: $SiO_2$>($Fe_2O_3$+CaO+$Na_20$) (acidic)

For Lignitic type ash: $SiO_2$<($Fe_2O_3$+CaO+$Na_20$) (basic)

TABLE 13

| Bituminous Coal Ash | | Lignitic Coal Ash | |
|---|---|---|---|
| Fouling Propensity | $Na_2O$ (wt. %) | Fouling Propensity | $Na_2O$ (wt. %) |
| Low | <0.5 | Low | <2.0 |
| Medium | 0.5-1.0 | Medium | 2-6 |
| High | 1.0-2.5 | High | 6-8 |
| Severe | >2.5 | Severe | >8 |

Sodium equivalent criterion for boiler fouling propensity (bituminous coal)

$$\text{Sodium equivalent} = Na_2O_{eq} \text{ of coal} = (Na2O + 0.659\,K2O)\frac{Ash}{100}$$

TABLE 14

| Boiler Fouling Propensity | $Na2O_{eq}$ (wt. %) |
|---|---|
| Low | <0.3 |
| Medium | 0.3-0.45 |
| High | 0.45-0.6 |
| Severe | >0.6 |

* Applies to bituminous coals

Coal Ash Corrosion and High Temperature Corrosion as the TDM

Corrosion, corrosion indices—fireside/coal ash corrosion (OD), acid dew point corrosion (OD).

Corrosion Risk Assessment—high temperature corrosion; ash analysis, burning coals containing differing amounts of flame-volatized alkali metals

TABLE 15

| Risk of high-temperature corrosion | Flame-volatility (Na + K) of ash (wt. %) |
|---|---|
| Low | <0.5 |
| Medium | 0.5-1.0 |
| High | >1.0 |

Coal Corrosion Propensity—high temperature corrosion of superheater and waterwall tubing; coal analysis, burning coals containing differing amounts of chlorine

TABLE 16

| Risk of high temperature Corrosion | Chlorine content of coal (wt. %) |
|---|---|
| low | <0.15 |
| Medium | 0.15-0.35 |
| High | >.35 |

Ash/Chlorine Ratio—high temperature corrosion of superheater tubing; ash analysis, the ratio reflects the % of flame volatized alkali's captured by silicate ash. The higher the ratio, the more un-captured volatized alkali that can be converted to corrosive sulfates

TABLE 17

| Risk of high temperature corrosion | Ash (%) | Average Chlorine (%) | Ash-to-chlorine ratio |
|---|---|---|---|
| Low | 15-19 | 0.28 | 0.015 |
| Medium | 10-15 | 0.32 | 0.025 |
| High | 4-10 | 0.33 | 0.040 |

Acid Dewpoint Corrosion as the TDM

Corrosion, Maximum Acid Deposition Rate—acid dewpoint corrosion (economizer, air heater, flue gas outlet section)

From acidity characteristics of flue gas assuming 4% excess oxygen. Based upon sulfur (%) content of coal, CaO (%) in ash, SO□ (ppm) in flue gas, dewpoint temperature (K)

TABLE 18

| Maximum Acid Deposition Rate (mg m□$^2$) | | Sulfur in Coal (%) | CaO in Ash (%) | SO□ in flue gas (ppm) | Dewpoint Temperature (K.) |
|---|---|---|---|---|---|
| 5-10 (High) | High sulfur, low calcium | >2.5 | 2-5 | 10-25 | 400-410 |
| 2.5-5 (Medium) | Medium sulfur, low calcium | 1-2.5 | 2-5 | 5-10 | 295-400 |
| 1-2.5 (Low) | Medium sulfur, medium calcium | 1-2.5 | 5-10 | 1-5 | 285-295 |
| <1 (non-acidic) | Low sulfur, high calcium | <1 | >10 | <1 | <28.5 |

It is of interest to note that excess oxygen levels and acid deposition rates are inversely proportional because production of CO suppresses SO3 formation. In addition, reduction of 1% excess oxygen in the flue gas can reduce acid deposition considerably due to reduced gas flow. It is desirable that under no circumstances should excess oxygen levels drop below 1.5% or CO levels be allowed to exceed 100 ppm. Furnace slagging and high temperature corrosion will result. Ideal excess oxygen in the flue gas is between 2.5 and 3%

By way of yet further example, consider Water Chemistry Control and Corrosion using On-Line Monitoring. Examples of various targeted damage mechanisms are herein presented by way of example.

Chelant Corrosion as the TDM

With such a TDM, a "Rule" or algorithm operable with the processor may include the following criteria or steps: If unit is on, And if Chelating agents (Hydrazine) are in use, but overfed Or if Chelating Agents are in use as recommended, but evaporation is possible (DNB), And if local fluid velocity is high, And if dissolved oxygen levels are high, And if ID flow disruptions exist, And if boiler waterwall ID's are dirty; (>>30 mg/cm2) because Fe (≧10 ppb) and Cu (≧2 ppb) levels run high from poor pH and dissolved O2 control, And if Flame Impingement, localized boiling exists (bullet 3)≡ Then a threat of Chelant Corrosion exists. It is of interest to note that Chelant Corrosion damage is similar to Flow-Accelerated Corrosion damage and care should be taken in determining root causes of damage.

Acid Phosphate Corrosion as the TDM (Risk=Deterioration Rate≦2 mm/yr.)

A Rule or algorithm operable with the processor may be as follows:

if Unit on
And if Excessive Waterside Deposits (>>30 mg/cm2)
And if Tube ID flow disruptions
And if Flame Impingement, localized boiling exists
And if High levels of feedwater corrosion products (Fe, Cu)
pH, cation conductivity, dissolved O2 consistently OOR
and if Persistent phosphate hideout "chased" with excessive use of mono and di-sodium phosphate
and if pH depression
≡ Then threat of Acid Phosphate Corrosion exists Caustic Gouging as the TDM (Risk=Deterioration Rate≦2 mm/yr.)

Rule:
If unit is in start-up or on,
And if NaOH/NaPO4 is used (free NaOH>>2 ppm) or used in conjunction with AVT or CPT
And if pH rises significantly
And if flame impingement, localized boiling is possible
and if boiler waterwall ID's are dirty; (>>30 mg/cm2) because Fe (≧10 ppb) and Cu (≧2 ppb) levels run high from poor pH and dissolved O2 control
And if poorly maintained; tube ID flow disturbances exist,
≡ Then threat of Caustic Gouging exists.

Hydrogen Damage as the TDM (Risk=Deterioration Rate>10 mm/yr.)

Rule:
If unit is on,
And if major acid contamination event has occurs; pH drops,
And if boiler waterwalls are dirty (>>30 mg/cm2) because Fe (≧10 ppb) and/or Cu (≧2 ppb) levels run high from poor pH and dissolved O2 control
And if waterwalls are poorly maintained causing flow disruptions
And if chemical cleaning process errors are suspected
And if flame impingement is possible,
≡ Then threat of Hydrogen Damage exists Chemical Cleaning Damage as the TDM Such is typically incidental, and no on-line monitoring is performed.

Corrosion Fatigue as the TDM

Rule: Synergy must exist between environment and thermal/cyclic stress/strain for Corrosion Fatigue to Occur
If unit is in start-up or shut-down mode (Transitional tube ΔT)
And if pH, Cat. Cond. and/or Dissolved O2 are typically OOR
Or if unit is at full pressure (Max ΔT tube to attachment) and pH, cat.
Cond. and/or Dissolved O2 are typically OOR
And if unit EOH are high (High Cold Start/Stops)
And if good lay-up techniques are not employed when unit is OOS (pits form)
≡ Then threat of Corrosion Fatigue Exists Supercritical Waterwall Cracking as the TDM Rule:
If unit is on,
And if boiler waterwalls are dirty (>>30 mg/cm2) because Fe (≧10 ppb) and/or Cu (≧2 ppb) levels run high from poor pH and dissolved O2 control (Chordal Thermocouples)
And if tube sections are in the path of a sootblower (Water or Steam)
And if fluid temperature is above 735□F
≡ Then threat of Supercritical Waterwall Cracking exists Coal-Ash (Fireside) Corrosion as the TDM Rule:
If unit is on,
And if the corrosive properties of coal slag denote,
And if waterwall circuit pressure drop (ΔP) indicates increasing water-side deposition And if heat flux measurements (chordal thermocouples) indicate an increase in average tube metal temperature with a decrease in tube-to-fluid heat transfer (ΔT)

≡ Then the threat of Coal-Ash Corrosion exists

Short-Term Overheating as the TDM

Rule:

Incidental (Falling Slag Damage), no on-line monitoring

And if the slagging properties of the fuel denote,

≡ Then the threat of Falling Slag Damage exists

A "Contingency Rule" may include:

If unit is on,

And if the slagging properties of the fuel denote,

And if waterwall circuit pressure drop (ΔP) indicates increasing water-side deposition And if heat flux measurements (chordal thermocouples) indicate an increase in average tube metal temperature with a decrease in tube-to-fluid heat transfer (ΔT)

≡ Then the threat of Short-Term Overheating exists

Fatigue (Thermal, Cyclic, Vibration) as the TDM

Rule: If unit is starting up or shutting down

And if tube/header/fixture temperatures are in transition,

And if temperature ramp rates are accelerated beyond design

Or if sub-cooling occurs during shut-down (natural circulation boilers only)

≡ Then the threat of Thermal Fatigue exists

Or:

If unit is on,

And if gas flow path has changed

And if gas flow excites any natural frequencies of tube sections and vortex shedding occurs (audible)

≡ Then the threat of Vibration Fatigue exists

Pitting Corrosion as a TDM

Typically incidental and no on-line monitoring is performed

Coal Particle Erosion as the TDM Typically incidental, thus no on-line monitoring Consider erosion and related damage mechanisms.

Flow-Accellerated Corrosion (FAC) as the TDM

Rule: If unit is on, and under AVT cycle chemistry,

And if Ph (Low), Dissolved O2 (<<1 ppb), N2H2 (>>20 ppb), Cation

Conductivity (>0.15 μS/cm), Cu and Fe (>>5 PPB) at the economizer inlet are OOR, creating a reducing environment, ≡ Then the threat of FAC of the economizer inlet header and stubs exists It is of interest to note that the threat is eliminated once the unit is transferred from AVT to O2 treatment.

Degrading Material Properties

Consider degradation of material properties and related damage mechanisms by way of further example.

Fatigue as the TDM (Thermal, Vibration, Cyclic)

Hot Starts

Physical count Vs. Design/component

Cold Starts

Physical count Vs. Design/component (historical records)

Full-Load Trips (uncontrolled shut-down)

Physical count/component (historical records)

Operating hours/component

Chronological measure/component (since installation) (GAR Database)

≡ Calculate expended fatigue life (actual/design) per component

Creep/long-Term Overheating as the TDM

Average Temperature

Trend (historical records)

Operating Hours/Component

Chronological measure/component (since installation) (GAR Database)

≡ Calculate remaining useful life fraction (actual/design) per component

With reference again to FIG. 1, utilizing a Conditional Analysis Technique, herein referred to as CAT (a software engine), see Operational Consequences Means 14 for calculating an absolute value of the attributes and for correlating each attribute with a corresponding damage mechanism that it causes. Utilizing the CAT software engine, the value of each attribute is calculated with its relative severity, based on industry-accepted standards and scales. Using output from the processor 12 employing the CAT, component-specific tables are generated. Analytical results are organized and corresponding damage mechanisms provided by typical damage precursors, root-causes, type, location, orientation and save for consideration when developing detailed off-load test & inspection plans and on-load monitoring schemes.

As a result, relative boiler design and actual gas and steam temperature, pressures and flow profiles are provided from contract boiler forms and plant data acquisition, historian input, and output lists may be provided as desired. By way of example, such may be used for boiler design review and as condition data for deriving the diagnostic rules. As above described with reference to FIGS. 1 and 2, output data from the CAT and Operational Consequence Means 14 will be used during development of detailed on-load and off-load plans and strategies during the development plan and strategy process 16.

With regard to the Conditional Analysis Technique (CAT), one objective is to help minimize boiler tube failures, as herein described by way of example, through a better understanding of the damaging characteristics of fuel, water treatment, operating hours, thermal cycles and time at temperature on boiler components utilizing the processor 12 operating with the CAT software. Such an approach automates the organization and analysis of equipment (tube and header, by way of example) damage-forecasting and mitigation strategies and aids in developing an operating strategy for the boiler. It will be appreciated by those of skill in the art that scientific insight is provided that helps the user establish accurate failure defense strategies based on the damaging characteristics of current static operating parameters that would otherwise be missing or fragmented. As illustrated with reference to the above description of targeted damage mechanisms, data provided by CAT may include tubing and header materials employed for likelihood of material/operating environment-specific damage mechanisms, constituent fuel impurities (% by weight) for likelihood of gas-side corrosion, erosion/abrasion and slagging, constituent water-cycle chemistry control chemicals for likelihood and type of water-side corrosion, count of current operating hours by component for likelihood of long-term overheating, count of current thermal cycles for cyclic for likelihood of thermal and corrosion fatigue, and the like. A CAT "Wizard" allows for a selection of the desired conditional inputs of interest. A prompting format guides the user through requisite calculation data inputs. A CAT Analysis Calculation Form may be provided. Organized by calculation type, CAT establishes the desired calculation to be performed. Once run, the calculation will yield the desired conditional resultant. When formatted and reported the conditional resultant may be used as input to the detailed component condition monitoring strategy 16.

Figure 2:
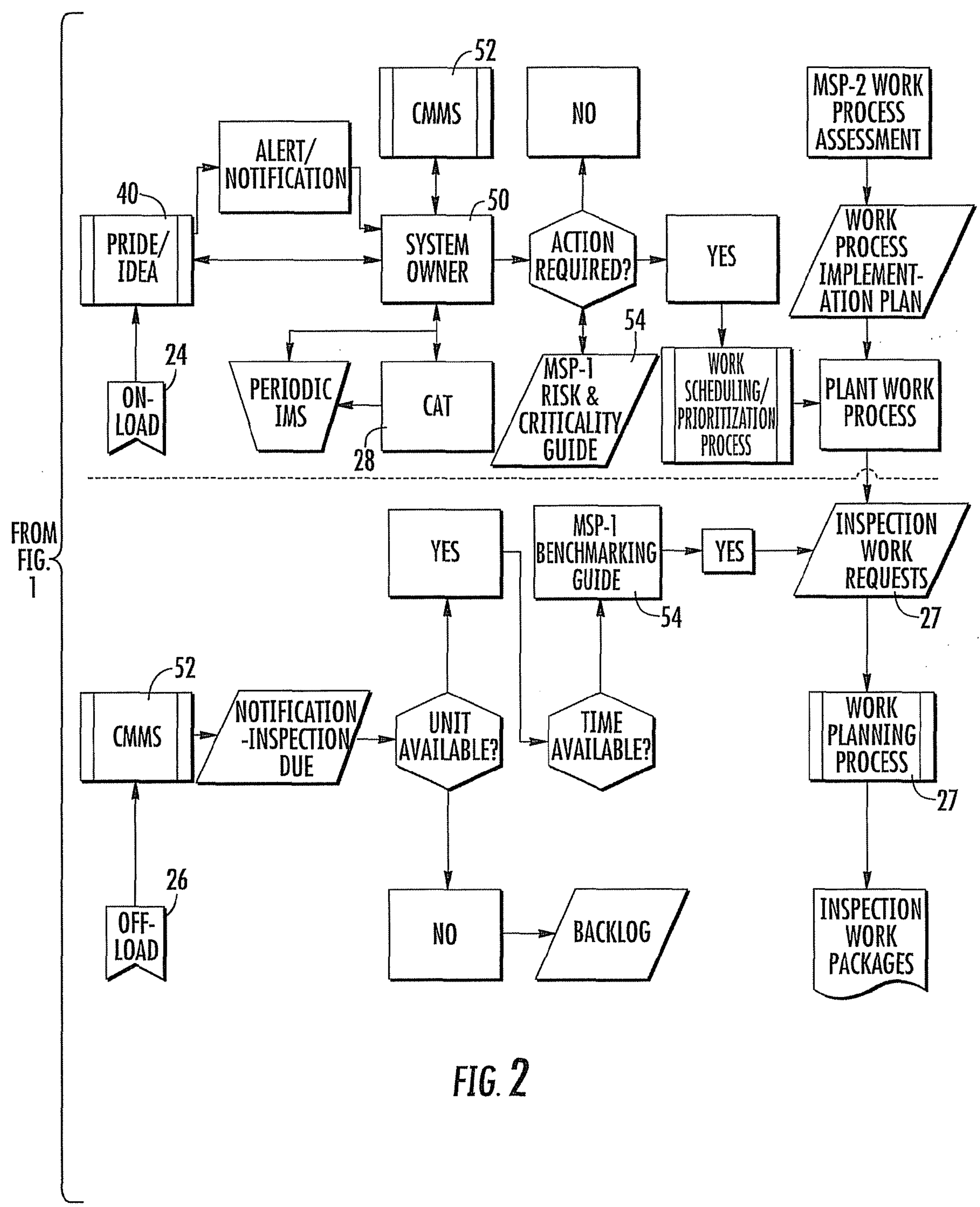
FIG. 2 is a block diagram further illustrating an integration of results from FIG. 1 into a work process to assure sustainability according to the teachings of the present invention.
Figure 3:
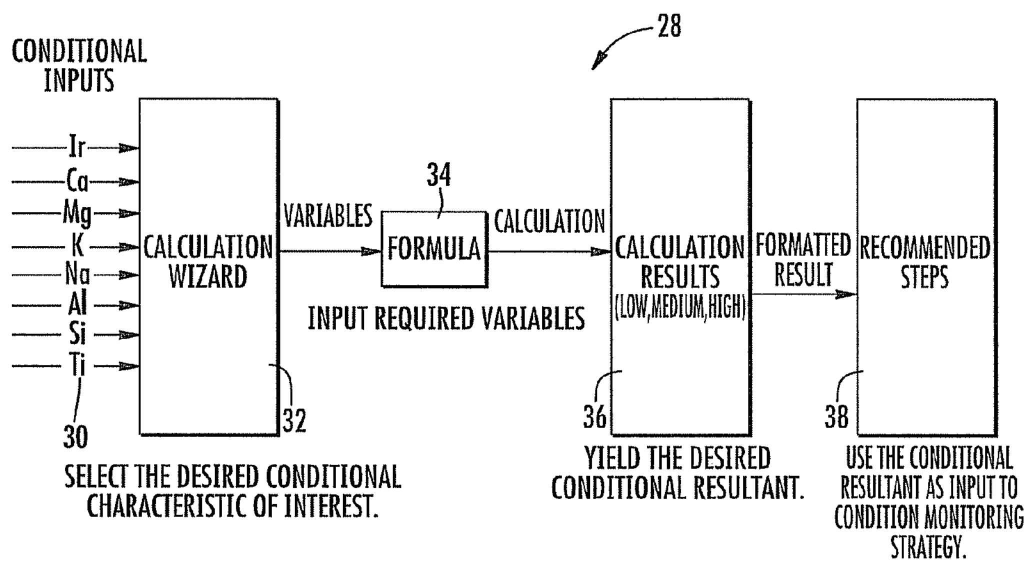
FIG. 3 is a block diagram illustrating a functionality of one software engine employing a conditional analysis technique according to the teachings of the present invention.

As further illustrated by way of example with continued reference to FIG. 1 and to FIG. 3, the conditional analysis software provides a context and a starting point on current operational characteristics of the pressure parts from a historical standpoint. This enables insight into potential damage mechanisms that may be active or incipient based on influences of the boilers global operating environment. The CAT 28 uses static data as conditional inputs 30 to perform calculations. A calculation wizard 32 is used to guide the user in selecting a set of desired conditional characteristics of interest. Based on an analysis 34, derived from accepted industry standards, including relationships as above provided by way of example, the CAT will yield a calculation result 36. The CAT 28 then formats the result into a reader-friendly format. The formatted results are either digital (go/no-go) or scalable/analog (low, medium, or high severity). Based on the calculation result, a set of recommended steps 38 is devised for the user to perform in order to maintain or improve the boiler's condition.

By way of example, boiler environmental factors may include fuel used to determine post-combustion slagging, abrasive and corrosion characteristics of the fuel ash based on the elemental/chemical composition of impurities for boiler tubes and headers exposed to it. The outputs from the CAT 28 are used to guide optimization of the metallurgical/structural design or selection of damage mitigating inspection tasks at locations where the likelihood of damaging characteristics of the ash laden gas exist. Water treatment may be used to determine what corrosive damage characteristics emerge when high temperature and pressure fluid control parameters are exceeded in boiler tubes and headers, when or at what point damage is likely. For such a case, the outputs from the CAT are used to guide optimization of the metallurgical/structural design or selection of damage quantifying inspection tasks at locations where the likelihood of damage is the greatest. Fatigue life barometer may be used to determine where component materials are currently in their design fatigue life. This provides a relative measure to guide prudent operational and inspection task recommendations/modifications. Pressure parts are designed to withstand damage that occurs as a result of physical or thermally induced stress for a certain number of cycles. A creep-stress barometer may be used to determine where component materials operating at or near oxidation temperature limits are currently in their design life based on hours of operation (time at temperature). This provides a relative measure to guide prudent operational and inspection task recommendations/modifications. Time-dependant pressure parts are designed to withstand damage that occurs as a result of physical or thermally induced stress for a certain number of operating hours.

With reference again to FIG. 1, the instruments enabling step 18 may comprise a) transferring instrument input and output data to the data storage; b) sorting the instruments by boiler system and component; c) modeling an ideal system and component condition; d) modeling at least one of a plurality of actual and a plurality of potential damage mechanisms for the boiler and components thereof; e) analyzing existing instruments and the plurality of damage mechanisms for determining a need for providing additional instrumentation for in-service monitoring and control of damage mechanisms primarily responsible for tube and header damages; f) performing a risked based economic analysis to justify procurement of the additional instrumentation; g) repairing non-functioning yet essential condition-monitoring instruments; h) installing and testing the condition-monitoring instruments; i) transmitting instrument output signals to an in-service condition monitoring acquisition system, or a combination thereof.

Figure 4:
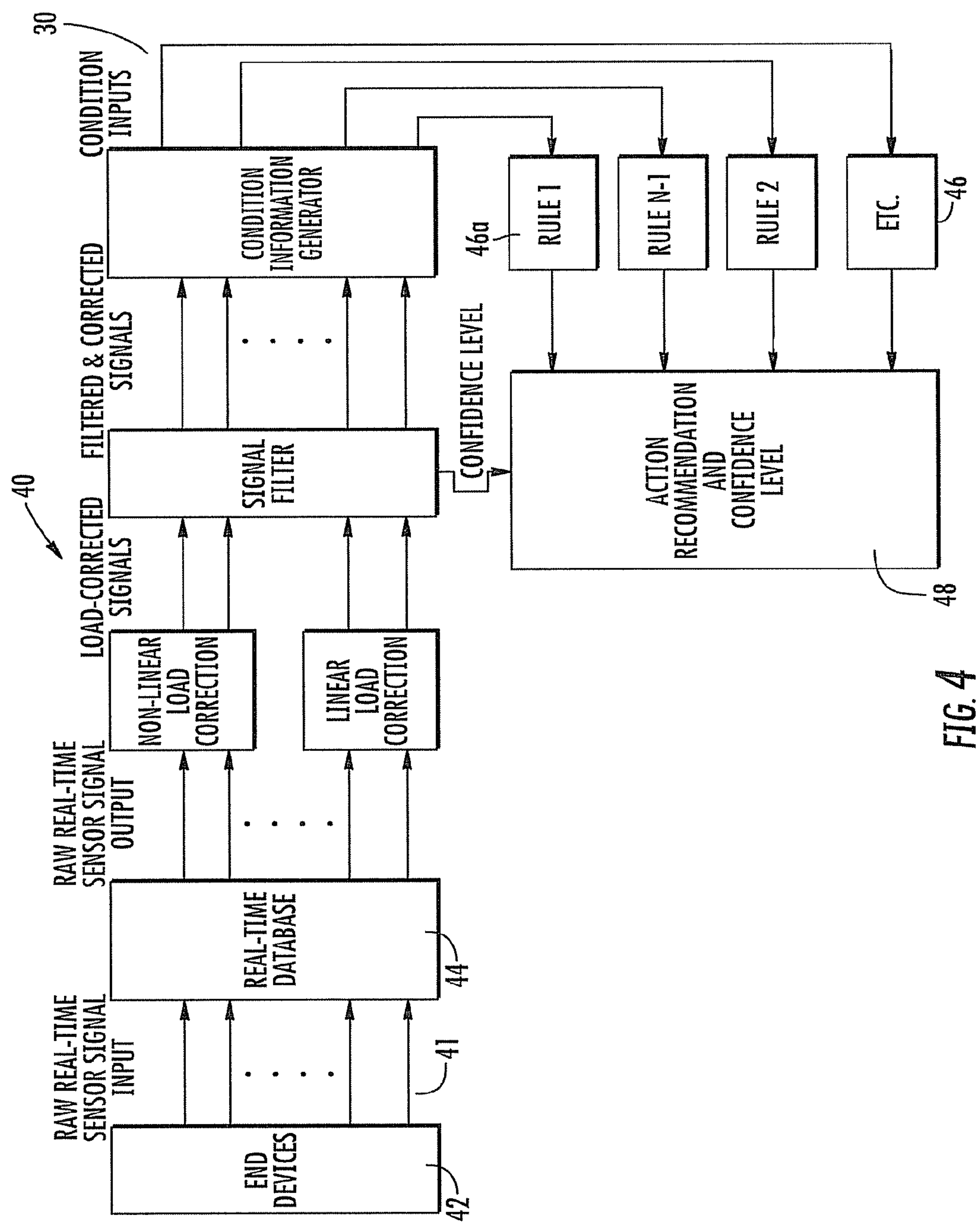
FIG. 4 is a block diagram illustrating a functionality of one software engine employing a continuous monitoring and diagnostics according to the teachings of the present invention.
Figure 5:
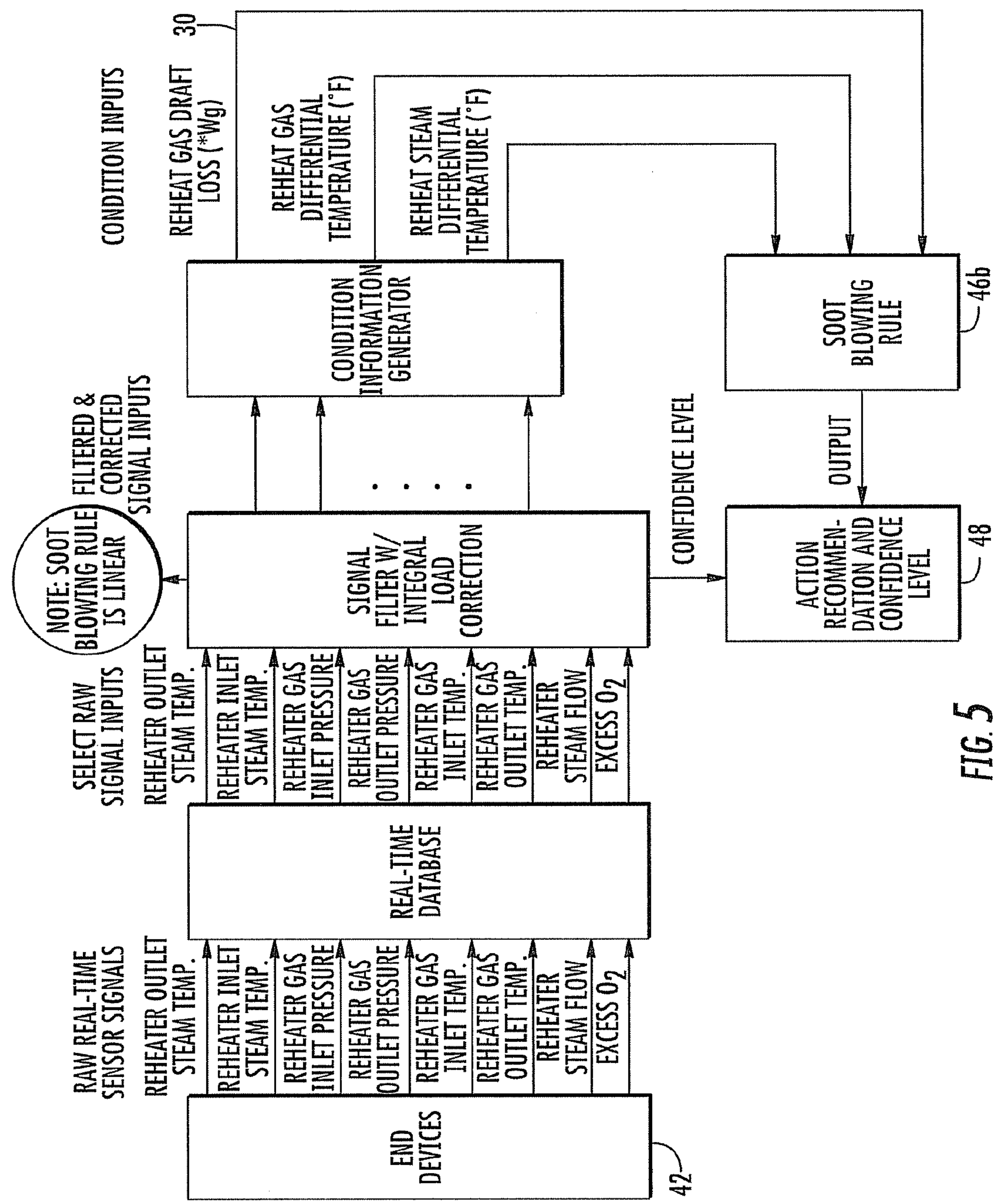
FIG. 5 is a block diagram illustrating a functionality of the software engine of FIG. 4 for a preselected target failure mechanism.

As is understood by those of ordinary skill in the art, conditions change quickly that can adversely influence the metallurgy of the boiler pressure parts. The present invention makes resulting damage predictable and as a result, it may be avoided if the precursors to damage can be corrected through timely precision operational intervention. As illustrated with reference again to FIG. 1 and to FIG. 4, the instrumentation enabling 18 preferably includes processing software containing Boolean logic based rules, the software herein referred to as PRIDE/IDEA 40 operable with appropriate instrumentation for predicting such situations. The PRIDE/IDEA 40 software permits continuous monitoring and diagnostics and uses select sets of dynamic data, with filters (such as predefined acceptable input signal ranges and signal standard deviations) for determination of signal quality (actual vs. design) and correction for boiler output load-point, to perform calculations. Signal data 41 from monitoring instruments 42 are delivered and input to a real-time database 44, by way of example web based, Oracle or SQL based. The software engine 40 receives the signals from a database 44 then inputs appropriate modeled (bundled in step 18) and mapped to formulate required inputs into TBM defined, Boolean rules 46, as above described by way of example. When certain circumstances are determined to exist, as defined by the rules bounding parameters, the engine 44 then executes, based on the logic of the appropriate rule **46*a* to yield a result 48 which will provide proactive recommended actions for the user to perform in order to maintain the boiler's integrity. One process applicable for a boiler is herein presented for a reheater and illustrated with reference to FIG. 5. As illustrated, a go/no-go soot-blowing rule 46*b* to help defend against the sootblower erosion damage mechanism resulted through use of the PRIDE/IDEA 44**, so named for providing a proactive intelligent diagnostic engine (PRIDE) and/or an intelligent diagnostic engine application (IDEA). The CAT and PRIDE/IDEA software utilize features of the C++ language to take an object oriented approach. The software operates as a finite state machine based on user input.

The instruments 42 were selected for providing temperatures, pressures and flows for characterizing the current operational state of the reheater with respect to the need to sootblow or not. The conditional inputs 30 included gas draft loss, reheat gas differential temperature and steam differential temperature. In addition to a recommendation, the result 48 may provide a template identifying the possible damage mechanism, cause, mode, and potential failure locations, and a recommended strategy, as illustrated in the Table of FIGS. 6A and 6B and embellished upon in a detailed test and inspection plan and strategy herein presented for the reheater, by way of example. The macroscopic in-service and out-of-service condition monitoring plan development uses such a consolidated targeted boiler management template 48 to serve as a boiler inspection guideline.

As will be appreciated by those of ordinary skill in the art, the use of PRIDE/IDEA 40 minimizes equipment failures, herein referencing boiler tube failures by way of example, through an on-line defense utilizing the processor, relational database software and surveillance techniques. Such an approach converts available data, as above described, to useful information to drive timely corrective action. Surveillance techniques make use of individual or combined measurable precursors (conditions known to impart material damage to boiler tubes and headers) and artificial intelligence. As a result, a full time (24/7) monitoring, diagnosis and notification of abnormal conditions for advanced correction of conditions works to preserve short and long term equipment reliability. Data input signals will be representative of operating conditions, measurable, and time-stamped. A database will be a relational database for data mapping and data recovery. Software interfaces between database and M&D software are provided. An ability to poll damage data sets at reasonable real-time frequencies (determined by processor capability) is provided. There is an ability to check data validity, an ability to send sets of qualified data to appropriate diagnostic rule, an ability to disposition data as "normal" or "abnormal" by comparing actual values with load points on characteristic curves, an ability to generate and issue corrective suggestion(s) sequence(s) locally through computer monitor on-screen messaging or printed report, and an ability to notify remotely through instant or email messaging, and if normalizing damage precursors is not possible, measuring the time that the parameter or parameters are out of bounds for use in root cause failure analysis later.

The system 10, illustrated with reference again to FIGS. 1 and 2, provides a processor and software application that not only monitors component conditions, but carries out diagnoses of sensed anomalies to the extent possible so people are less burdened. The software application utilizes continuously-streamed, select sets of dynamic data from the DCS data acquisition system and other 3$^{rd}$ party software applications that contain useful date, grouped logically by precursors (that can lead to one of many damage mechanisms, then filter it in order to "flag" signal anomalies, correct the data for unit load conditions to assure relativity and repeatability, convert it to more useful condition indicators (Temperature, Pressure, and the like), send the condition indications to a "smart" Boolean rule base that contains logic-based rules written to alert the end user (operator, system owner, plant manager, etc.) when a precursor or precursors exist that are out of acceptable range to mimic creation of damage. This yields monitoring diagnostics monitoring of damage with reasonable likelihood (Time out of compliance) and type (complex data variations/combinations of damage to be expected to boiler components by operating under these circumstances as a first step to understanding and mapping potentially active damage that would result.

One instrument optimization audit process for enabling and augmenting existing instrumentation for maximum value may include copying instrument I/O's to a computer spreadsheet, using spreadsheet functionality to sort instruments by boiler component, modeling "ideal" component condition monitoring by understanding damage precursors, damage mode, damage mechanism and failure causes, modeling all actual and potential component damage mechanisms for each boiler (as illustrated in table of FIG. 7), performing analyses to define "gaps" between existing instrumentation and instrumentation needed for monitoring active or potential damage mechanisms, and recommending additional instrumentation. As above described, the creation of detailed condition monitoring plans from the macroscopic plans by the processor classifies each damage mechanism as one of active, incipient, incidental and passive, and processes each classified damage mechanism based on industry and local historical data to provide yield indices and propensities as reference for the FMEA 16.

An economic analysis may be performed to justify and prioritize procurement of recommended instrumentation based on potential damage status and consequences or risk. Benefactor responsibilities may thus include repairing all non-functioning yet essential condition-monitoring instrumentation, procuring, installing and testing all justified condition-monitoring instrumentation, and connecting instrument output signals to an on-load condition monitoring acquisition process. When used in conjunction with the continuous monitoring & diagnostic tool (IDEA/PRIDE), maximum utilization of on-load condition monitoring for defending against the potential damage mechanisms detailed in the on-load condition monitoring plans and strategies.

Figure 8:
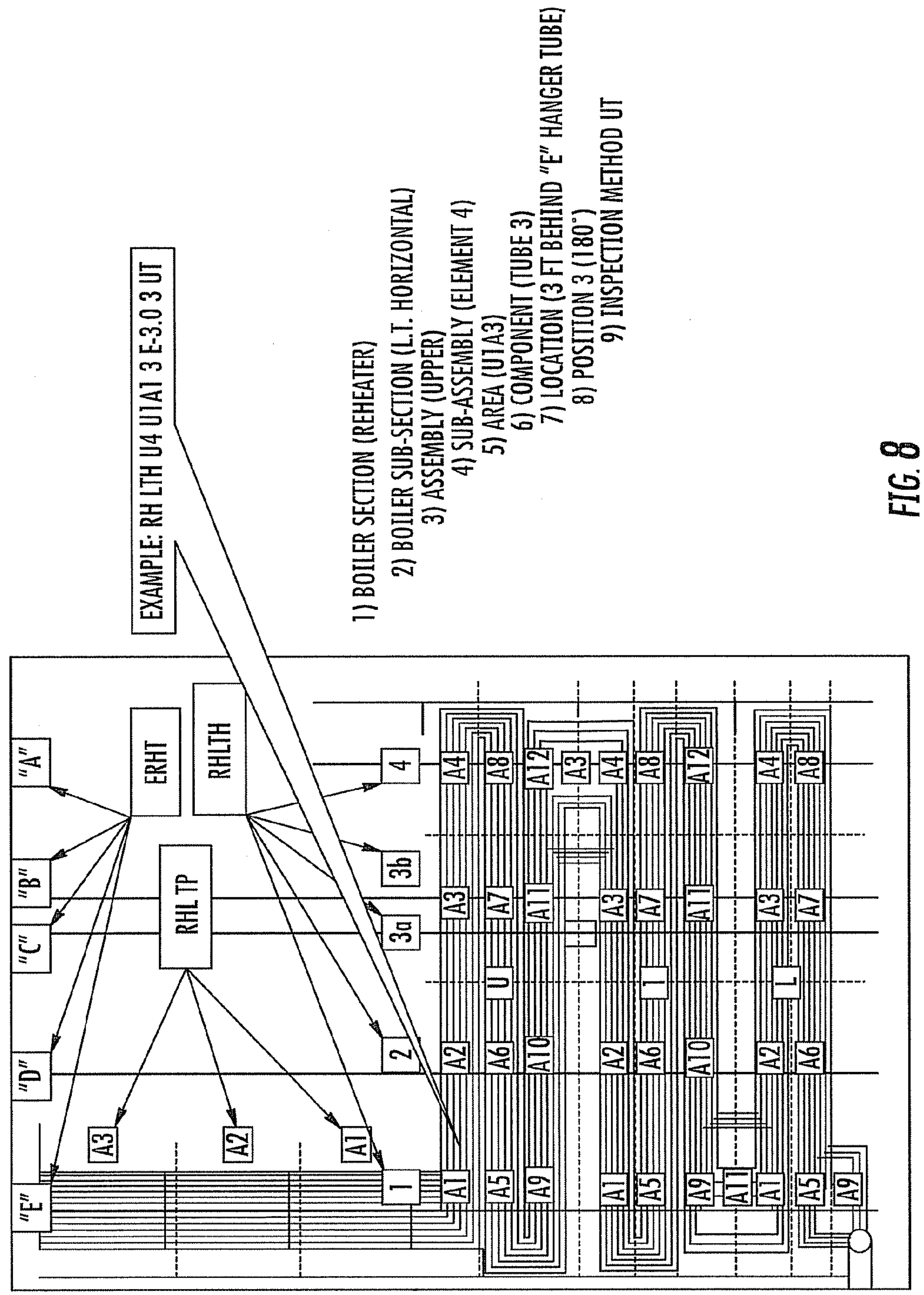
FIG. 8 is a graphic illustrating one embodiment of an alpha numeric identifier for a targeted inspection to mitigate a failure mechanism in a boiler system.

With reference again to FIG. 1, the graphic component map forming 22 may provide an alpha-numeric character string to enable electronic linking of existing, in-house data management software applications to in-service and out-of-service condition monitoring plans and strategies, wherein the in-house data management software applications comprises at least one of a computerized maintenance management system, an out-of-service periodic inspection data management system, and an in-service continuous data management system. One graphic map is illustrated with reference to FIG. 8, by way of example for one boiler section.

The graphic component map forming may include a) defining boundaries for boiler systems and components; b) assigning equipment identification numbers (EIN) and descriptions sufficient computerized maintenance management system (CMMS) use; c) creating unit-specific tube and header computer aided design (CAD) diagrams; d) transferring the CAD diagrams to an alternative graphic software application; e) diagramming inspection area boundaries based on potential damage mechanisms and stationary references both inside and outside of the boiler, wherein the stationary references comprise at least one of assembly/section field pressure welds, tubing cut points, sootblower ports, inspection doors, hanger tube positions and external platform elevations; f) creating parent-child component and sub-component alphanumeric character strings for providing area inspection numbers (AIN) and associate an existing EIN with plans and strategies; g) assigning the AIN following a steam and water flow path sequence, wherein lower AIN are nearer to a system inlet and higher AIN are convention, whereas smaller AIN are closer to a section inlet, larger closer to a system outlet; h) transferring the AIN to the data storage, or a combination thereof.

As above described, the macroscopic in-service 24 and out-of-service 26 condition monitoring plans developing uses such a consolidated targeted boiler management template 48, as illustrated with reference to FIGS. 9A and 9B forming a sample template, to serve as a boiler inspection guideline. The macroscopic in-service and out-of-service condition monitoring plans developing may also comprise developing a generic area-specific condition monitoring and diagnostic plans and strategies including a) methodically following system gas and water/steam flow component by component and area by area, b) assigning potential damage mechanisms, failure modes, failure causes and appropriate on and out-of-service mitigation strategies, or a combination of both. Yet further, creating the detailed condition monitoring plan may include a) defining current active damage mechanisms and mitigation plans, as above described; b) collecting site-specific engineer and inspector knowledge for a task benchmarking, reliability risk ranking, and prioritization (TB&RP) processing; c) analyzing North American Electric Reliability Council (NERC) Generation Availability Data (GAD) boiler cause-codes and extracting and storing locations by system; d) establishing a baseline for at least one of mean time to repair (MTTR), mean time to inspect (MTTI) and mean time between failures (MTBF) from event timelines for mapping potential failures; e) examining existing boiler tube failure root-cause analysis results to extract, map, validate and document failure causes, mechanisms, modes and locations; f) incorporating operational consequences and map vulnerable areas resulting from the determining operational consequences determining step through use of the processor; g) mapping the instruments identified in the instruments enabling step to physical boiler locations, or a combination thereof. As illustrated with reference again to FIG. 2, a system owner 50, or a person responsible for reliability of boiler pressure parts, may choose to use well known computerized maintenance management software (CMMS) 52 in combination with the CAT 28 and the in-service and out-of-service information management applications to evaluate required actions to be taken based on input from the risk and criticality information provided by the invention.

As supported by the above examples, defining the current active damage mechanisms and mitigation plans includes the processor 12 a) compiling non-site-specific industry damage/failure data from at least one of similar boiler units in a fleet of boiler units, from OEM technical publications and from industry databases; b) compiling data from past boiler inspection reports for the boiler; c) compiling data from a current boiler inspection program for the boiler; d) compiling capital replacement program and timeline data; e) compiling component modification or justification history for the boiler; f) transcribing mapped data to appropriate areas on condition monitoring plans and strategies, or appropriate combinations a selected by the user.

Yet further, there is value in collecting site-specific engineer, operator and inspector knowledge for a task benchmarking, reliability risk ranking, and prioritization (TB&RP) processing 54 comprises a) laminating current boiler elevation diagrams to serve as damage maps; b) mapping damage locations; c) mapping damage types; d) extracting root-cause opinions; e) mapping modification locations; f) transcribing the mapped data to appropriate areas on condition monitoring plans and strategies, or a combination thereof.

Examining all existing boiler tube failure root-cause analysis reports to extract, map and document failure causes, mechanisms, modes and locations comprises at least one of processing metallurgical evaluations and chemical analyses and auditing a type of and progress on corrective resolutions identified to an address root-cause, and identifying resolved root-causes as inactive.

As above described, a result of the detailed plans and strategies 16 described with reference to FIG. 1, includes a determination of which damage mechanisms are candidates for an in-service condition monitoring 24 through the processor and which are not candidates and handled through out-of-service 26 testing and inspecting 27. Risks a re then ranked and tasks prioritized with the processor calculating risk parameters including repair time, cost and availability consequence for each identified failure, the processor combining condition monitoring outputs for failure probabilities for quantifying the risk to support decision-making, the processor further determining criticality for economic/budgetary prioritization of recommended protection schemes for all the identified failure scenarios based on benefit-to-cost.

The present invention eliminates unwanted heat exchanger (boiler) pressure part failure, by way of example, through improved processes supported by computer software that allows a myriad of technical data to be quickly converted to useful information for the boiler pressure part responsible. Typically complex equipment conditions are made easy to understand and threats to reliability better managed. An organization is thus better managed through complimentary and coordinated work processes.

Using a realistic boiler operation scenario by way of example, and with reference again to FIGS. 1 and 2, consider the situation where the TBM system and method 10 above described have been implemented on Unit 3 boiler for six months and all personnel have received training. Because of the TBM's innovative approach, the system owner 50 (or person responsible for the Unit 3 boiler pressure parts for the last few months) possesses a thorough understanding of boiler damage mechanisms through use of failure mode templates as illustrated by way of example with reference to FIGS. 9A and 9B, and the consequences of tube failures, from both an O&M expense and replacement energy standpoint in all locations they do or could exist in the boiler through the TB&RP 54. There is now a thorough understanding of manpower, material, as well as time duration required to access and perform inspections or repairs in every area of the boiler all housed within work packages 27 in the CMMS 52, and the current active/incipient DM status, those that do exist or are imminent on the unit 3 boiler, as determined in FMEA processor operation 16, as above described. There is now a knowledge of trendable NDE data, reflecting the active DM's progression in the most vulnerable/consequential areas (out-of-service IM tool, part of the "dashboard"), and the in-service 24 and out-of-service 26 and test & inspection strategies 16 that are in place to defend the boiler against boiler tube failures and, all of the out-of-service inspection task frequencies in work orders 27, managed by the work process (backlog management 52 and prioritization 54 and scheduled by the CMMS 52. In addition, the system owner's performance will typically be measured by his effectiveness typically based on Mean Time Between Failure (MTBF) for each boiler section as well as the efficiency in coordination including Mean Time To Repair/Inspect (MTTR/MTTI. This resides in the CMMS 52.

By way of continuing with the example, consider that the Unit 3 boiler was designed to be run continuously, but is currently brought off and on-line daily. It was also designed to burn Illinois Sub-Bituminous coal (high BTU, low erosion ash), but now burns western fuel (low BTU, high erosion ash as would be analyzed as above described by the CAT 28 analysis. The primary damage mechanisms causing tube failures are mechanical fatigue, vibration fatigue, flyash erosion and sootblower erosion and under-deposit corrosion, as established for the on-load and off-load monitoring plans 24, 26, above described with reference to FIG. 1. Because of the design and the current high duty cycle, the system owner is "on guard" watching for the onset of corrosion fatigue, per the condition monitoring plans 24, 26.

It is Monday morning and the unit is preparing to return to service to meet the load peak. The system owner goes to his computer monitor to check for notifications of impending issues that the operating PRIDE/IDEA 40 has posted. The unit shut down on Friday was rough. The cool-down temperature ramp rate was faster than design and there was a pH depression as the unit came off oxygenated (O2 and ammonia) cycle chemistry control to all-volatile (Ammonia and hydrazine) control—a potential chemical injection pump issue. With continued reference to FIG. 2, the system owner 50 checks the output from CAT 28, the conditioning monitoring plan 26 providing a T&IP and the CMMS 52 for the in-service and out-of-service information management software ("dashboard") applications to get a better understanding of impacts. The system owner observes that MTBF on the most vulnerable area for corrosion fatigue, the waterwall section over the burners, is decreasing as a result of the CMMS 52 and that the MTTR/I for inspecting that area is 55 hours, as shown by the work planning process 27. This is rated "A-Active" in the FMEA 16—a worst case situation according to (54*a*)—under-deposit corrosion is the culprit.

The system owner proceeds to the control room to talk with the operators. They like the system owner because he has credibility and is helpful, clearly as a result of using the claimed invention. The system owner asks what happened Friday evening and the operators respond aligned with his conclusion. During the morning management meeting, the system owner presents the situation, and requests that the chemical technicians pay particular attention to pH during the start-up water treatment transition and that the operators slow the startup ramp rate to slow the propagation of mechanical fatigue and to mitigate the onset of corrosion fatigue. The system owner also requests that a watchful eye be kept on conductivity and dissolved oxygen and that the operators bring the unit on with the lower level of burners instead of the upper level to mitigate the propagation of under-deposit corrosion. The Operations Superintendent asks the system owner if there is anything else to consider. The system owner responds by calling out sootblower erosion and flyash erosion as his other two "top hitters" but acknowledges that, in light of the impurities in the fuels being burned, a result of CAT 28 analysis, that care be taken to blowing soot only when other conditions that may be hampering heat transfer are satisfied and acknowledged as appropriate by the results from the PRIDE/IDEA 40 prompts (e.g. double check excess oxygen in gas to keep gas flow at safe minimums to minimize flyash and sootblower erosion and to check that they are not attemperating to lower steam temperatures) prior to making the choice to operate sootblowers to raise steam temperature. The meeting breaks up, all is satisfactory.

To continue with the sample scenario, on Wednesday at 3 pm, the Unit 3 boiler must be removed from service to repair a boiler feed pump problem. The unit is expected to be off 48 hours breaker to breaker which provides about 36 hours for maintenance. When the system owner learns of this news, he reviews his inspection backlog in the CMMS 52, references the risk and criticality guide 54, sorts the "A-Active" damage mechanism priorities and status areas for off-load condition monitoring plan 26 and sees that he has four high priority vulnerable areas that are overdue for inspection that fit within the 36 hour window according to the plan. He approaches the management team at the pre-outage meeting to lay out the inspection tasks and seek permission to spend money to execute the plan. According to the plan 26, the average Benefit to Cost is in excess of 200:1 so the management team agrees. The system manager meets with the outage planner to go over the Work Packages 27 to coordinate activities based on the available time. A clear schedule and plan is easily developed and the planner proceeds per the work packages 27. The system owner enjoys the weekend, comes in Monday with the unit back on and reviews the shut-down, start-up notifications from PRIDE/IDEA 40 and is satisfied. He next goes to his out-of-service information management tool to review the trending data that was collected and posted by the inspectors. He is not surprised. The data is realistic in that the deterioration rate of the damage to the vulnerable areas is consistent with past data. Finally, he goes to the CMMS 52 to review the MTTI's of the inspections that were performed to make sure that they did not cause a hold-up. He suspected not—he didn't get any calls. There were however some deviations in several inspection task durations, the deviations were, however, favorable. The tasks came in ahead of schedule. The reality is that the system owner can now reflect on a great year of operation for the boiler and for his associates responsible for operation of the boiler.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A computer-implemented method of quantifying operation of a boiler based on failure characteristics modelled in a computer having data storage coupled to a processor for effectively operating the boiler, the computer-implemented method comprising:

a) performing failure mode and effects analysis (FMEA) by the processor to forecast damage mechanisms from operational parameters;

b) sensing precursors that cause damage associated with the damage mechanisms by measuring physical characteristics of the precursors;

c) determining operational consequences by extracting and characterizing an inherent damage impact from the precursors;

d) enabling instruments for communicating with the processor for monitoring potential damage mechanisms resulting from the precursors;

e) diagnosing the potential damage mechanisms by the processor for determining an inherent damage impact from the precursors;

f) developing macroscopic in-service and out-of-service condition monitoring plans for the boiler;

g) classifying each damage mechanism resulting from the precursors as one of active, incipient, incidental and passive; and h) processing each classified damage mechanism for managing operation of the boiler.

2. The computer-implemented method according to claim 1, wherein the diagnosing potential damage mechanisms by the processor for the inherent damage impact from the precursors comprises:

a) identifying at least one failure mode resulting from at least one precursor;

b) determining a cause for the at least one failure mode and establishing a failure mechanism;

c) determining the precursor for the failure mechanism by characterizing damaging influences;

d) determining boiler operating conditions for measuring the precursor;

e) measuring the precursor through the monitoring step; and f) determining whether the precursor measuring is appropriate for in-service or out-of service monitoring.

3. The computer-implemented method according to claim 1, wherein the operational consequence determining step by extracting and characterizing an inherent damage impact from the precursors comprises:

a) determining potentially detrimental properties of impurities in a fuel operable with the boiler;

b) extracting a number of operating hours for each major component for determining a remaining useful life for the major component;

c) extracting a number of hot and cold starts in thermal cycles per major component for determining a potential for thermal fatigue;

d) extracting and mapping a mode of operation over time for determining a potential for cyclic fatigue; and e) determining a potentially detrimental damage from upsets in cycle water treatment.

4. The computer-implemented method according to claim 3, wherein the potentially detrimental properties determining step comprises at least one of:

a) determining deposition and slagging characteristics;

b) determining fuel and flue gas erosion characteristics; and c) determining post-combustion corrosion characteristics.

5. The computer-implemented method according to claim 4, wherein the deposition and slagging determining step comprises at least one of:

a) characterizing features of a firebox, superheater, reheater and economizer based on an ash composition;
b) determining BTU content of the fuel;
c) determining ash discharge proportions;
d) determining the slagging characteristics resulting from fuel mixing;
e) determining an acid to base oxide ratio;
f) determining an ash fusion temperature;
g) determining a pyritic iron content; and
h) determining a silica ratio.

6. The method computer-implemented according to claim 4, wherein the fuel and flue gas erosion characteristics determining step comprises at least one of:

a) determining boiler firebox dimensions, gas lane spacing, and tubing materials based on a combustion gas velocity parameter;
b) determining a calorific value of the fuel;
c) determining a hardness the ash; and
d) determining an average ash particle size distribution and ash quartz content.

7. The computer-implemented method according to claim 4, wherein the post-combustion corrosion characteristics determining step comprises at least one of:

a) determining a layout of firebox, superheater, reheater and economizer based on ash characteristics and composition;
b) determining theoretical gas and tube metal surface temperatures;
c) determining a composition of the tubes protective oxide layer;
d) determining a makeup of flame-volatized deposits in the ash; and
e) determining areas susceptible to reducing atmospheres.

8. The computer-implemented method according to claim 3, wherein the potentially detrimental damage determining step comprises at least one of:

a) extracting the damage mechanisms and the precursors characteristic of a feedwater chemistry control method;
b) auditing calibration data and schedules for feedwater chemistry analysis equipment;
c) auditing the feedwater chemistry analysis equipment for consideration in an on-load monitoring and diagnostic scheme;
d) extracting feedwater chemistry control limits;
e) extracting feedwater chemistry sampling routines; and
f) auditing control compliance and measuring a timeframe of upsets.

9. The computer-implemented method according to claim 1, wherein the instruments enabling step comprises at least one of:

a) transferring instrument input and output data to the data storage;
b) sorting the instruments by boiler system and component;
c) modeling operation of the boiler for determining potential or actual damage mechanisms for components thereof;
d) modeling at least one of the actual and the potential damage mechanisms for the boiler and components thereof;
e) analyzing existing instruments and the plurality of damage mechanisms for determining a need for providing additional instrumentation;
f) performing an economic analysis to justify procurement of the additional instrumentation;
g) repairing non-functioning yet essential condition-monitoring instruments;
h) installing and testing the condition-monitoring instruments; and
i) transmitting instrument output signals to an in-service condition monitoring acquisition system.

10. The computer-implemented method according to claim 1, further comprising forming a graphic component map sufficient for user review of preselected boiler locations, wherein the graphic component map forming step comprises use of an alpha-numeric character string to enable electronic linking of existing, in-house data management software applications to in-service and out-of-service condition monitoring plans and strategies, and wherein the in-house data management software applications comprises at least one of a computerized maintenance management system, an out-of-service periodic inspection data management system, and an in-service continuous data management system.

11. The computer-implemented method according to claim 10, wherein the graphic component map forming step comprises at least one of:

a) defining boundaries for boiler systems and components;
b) assigning equipment identification numbers (EIN) and descriptions sufficient computerized maintenance management system (CMMS) use;
c) creating unit-specific tube and header computer aided design (CAD) diagrams;
d) transferring the CAD diagrams to an alternative graphic software application;
e) diagramming inspection area boundaries based on potential damage mechanisms and stationary references both inside and outside of the boiler, wherein the stationary references comprise at least one of assembly/section field pressure welds, tubing cut points, sootblower ports, inspection doors, hanger tube positions and external platform elevations;
f) creating parent-child component and sub-component alpha-numeric character strings for providing area inspection numbers (AIN) and associate an existing EIN with plans and strategies;
g) assigning the AIN following a steam and water flow path sequence, wherein lower AIN are nearer to a system inlet and higher AIN are closer to a system outlet; and
h) transferring the AIN to the data storage.

12. The computer-implemented method according to claim 1, wherein the in-service and out-of-service condition monitoring plans developing step comprises using a consolidated targeted boiler management template to serve as a boiler inspection guideline.

13. The computer-implemented method according to claim 1, wherein the in-service and out-of-service condition monitoring plans developing step comprises developing generic area-specific condition monitoring and diagnostic plans and strategies including at least one of:

a) monitoring system gas and water/steam flow component by component and area by area; and
b) assigning potential damage mechanisms, failure modes, failure causes and appropriate on and out-of-service mitigation strategies.

14. The computer-implemented method according to claim 1, wherein the classifying step comprises at least one of:

a) defining current active damage mechanisms and mitigation plans;
b) collecting site-specific engineer and inspector knowledge for a task benchmarking, reliability risk ranking, and prioritization (TB&RP) processing;

c) analyzing North American Electric Reliability Council (NERC) Generation Availability Data (GAD) boiler cause-codes and extracting and storing locations by system;

d) establishing a baseline for at least one of mean time to repair (MTTR), mean time to inspect (MTTI) and mean time between failures (MTBF) from event timelines for mapping potential failures;

e) examining existing boiler tube failure root-cause analysis results to extract, map, validate and document failure causes, mechanisms, modes and locations;

f) incorporating operational consequences and map vulnerable areas resulting from the determining operational consequences determining step through use of the processor; and g) mapping the instruments identified in the instruments enabling step to physical boiler locations.

15. The computer-implemented method according to claim 14, wherein the step of defining current active damage mechanisms and mitigation plans comprises at least one of the processor:

a) compiling non-site-specific industry damage/failure data from at least one of similar boiler units in a fleet of boiler units, from OEM technical publications and from industry databases;

b) compiling data from past boiler inspection reports for the boiler;

c) compiling data from a current boiler inspection program for the boiler;

d) compiling capital replacement program and timeline data;

e) compiling component modification history for the boiler; and f) transcribing mapped data to appropriate areas on condition monitoring plans and strategies.

16. The computer-implemented method according to claim 14, wherein the step of collecting site-specific engineer and inspector knowledge for a task benchmarking, reliability risk ranking, and prioritization (TB&RP) processing comprises at least one of;

a) laminating current boiler elevation diagrams to serve as damage maps;

b) mapping damage locations;

c) mapping damage types;

d) extracting root-cause opinions;

e) mapping modification locations; and f) transcribing the mapped data to appropriate areas on condition monitoring plans and strategies.

17. The computer-implemented method according to claim 14, wherein the step of examining all existing boiler tube failure root-cause analysis reports to extract, map and document failure causes, mechanisms, modes and locations comprises at least one of processing metallurgical evaluations and chemical analyses and auditing a type of and progress on corrective resolutions identified to an address root-cause, and identifying resolved root-causes as inactive.

18. The computer-implemented method according to claim 14, further comprising determining which damage mechanisms are candidates for an in-service condition monitoring through the processor and which are not candidates and handled through out-of-service testing and inspecting.

19. The computer-implemented method according to claim 1, further comprising ranking risks and prioritizing tasks associated with the inherent damage impact from the precursors.

20. The computer-implemented method according to claim 19, wherein the processor calculates risk parameters including repair time, cost and availability consequence for each identified failure, the processor combining condition monitoring outputs for failure probabilities for quantifying the risk to support decision-making, the processor further determining criticality for economic/budgetary prioritization of recommended protection schemes for all the identified failure scenarios based on benefit-to-cost.

21. A computer-implemented method of quantifying operation of a system based on failure characteristics modeled in a computer having data storage coupled to a processor for effectively operating the system, the computer-implemented method comprising:

a) performing failure mode and effects analysis (FMEA) by the processor to forecast damage mechanisms from operational parameters;

b) sensing precursors that cause damage associated with the damage mechanisms by measuring physical characteristics of the precursors;

c) determining operational consequences by extracting and characterizing an inherent damage impact from the precursors;

d) enabling instruments for communicating with the processor for monitoring potential damage mechanisms resulting from the precursors;

e) diagnosing the potential damage mechanisms by the processor for determining an inherent damage impact from the precursors;

f) developing in-service and out-of-service condition monitoring plans for the system;

g) classifying each damage mechanism as one of active, incipient, incidental and passive; and h) processing each classified damage mechanism for managing operation of the system.

22. The computer-implemented method according to claim 21, wherein the diagnosing potential damage mechanisms by the processor for the inherent damage impact from the precursors comprises:

a) identifying at least one failure mode of the system;

b) determining a cause for the at least one failure mode resulting from at least one precursor and establishing a failure mechanism;

c) determining the precursor for the failure mechanism by characterizing damaging influences;

d) determining operating conditions of the system for measuring the precursor;

e) measuring the precursor through the monitoring step; and f) determining whether the precursor measuring is appropriate for in-service or out-of service monitoring.

23. The computer-implemented method according to claim 21, wherein the operational consequence determining step by extracting and characterizing an inherent damage impact from the precursors comprises:

a) determining potentially detrimental properties of impurities in a material operable with the system;

b) extracting a number of operating hours for each major component for determining a remaining useful life for the major component;

c) extracting a number of hot and cold starts in thermal cycles per major component for determining a potential for thermal fatigue of the system;

d) extracting and mapping a mode of operation over time for determining a potential for cyclic fatigue; and e) determining a potentially detrimental damage from upsets in cycle water treatment.

24. The computer-implemented method according to claim 21, wherein the instruments enabling step comprises at least one of:

a) transferring instrument input and output data to the data storage;

b) sorting the instruments by subsystem and component;

c) modeling operation of the system for determining potential or actual damage mechanisms for components thereof;

d) modeling at least one of the actual and the potential damage mechanisms for the system and components thereof;

e) analyzing existing instruments and the plurality of damage mechanisms for determining a need for providing additional instrumentation;

f) performing an economic analysis to justify procurement of the additional instrumentation;

g) repairing non-functioning yet essential condition-monitoring instruments;

h) installing and testing the condition-monitoring instruments; and i) transmitting instrument output signals to an in-service condition monitoring acquisition system.

25. The computer-implemented method according to claim 21, further comprising forming a graphic component map using an alpha-numeric character string to enable electronic linking of existing, in-house data management software applications to in-service and out-of-service condition monitoring plans and strategies, wherein the in-house data management software applications comprises at least one of a computerized maintenance management system, an out-of-service periodic inspection data management system, and an in-service continuous data management system.

26. The computer-implemented method according to claim 25, wherein the graphic component map forming step comprises at least one of:

a) defining boundaries for subsystems and components;

b) assigning equipment identification numbers (EIN) and descriptions sufficient computerized maintenance management system (CMMS) use;

c) creating unit-specific tube and header computer aided design (CAD) diagrams;

d) transferring the CAD diagrams to an alternative graphic software application;

e) diagramming inspection area boundaries based on potential damage mechanisms and stationary references both inside and outside of the system;

f) creating parent-child component and sub-component alpha-numeric character strings for providing area inspection numbers (AIN) and associate an existing EIN with plans and strategies;

g) assigning the AIN following a steam and water flow path sequence, wherein lower AIN are nearer to a subsystem inlet and higher AIN are closer to a subsystem outlet; and h) transferring the AIN to the data storage.

27. The computer-implemented method according to claim 21, wherein the in-service and out-of-service condition monitoring plans developing step comprises using a consolidated targeted system management template to serve as a system inspection guideline.

28. The computer-implemented method according to claim 21, wherein the in-service and out-of-service condition monitoring plans developing step comprises developing a generic area-specific condition monitoring and diagnostic plans and strategies including at least one of:

a) monitoring system operations component by component and area by area; and b) assigning potential damage mechanisms, failure modes, failure causes and appropriate on and out-of-service mitigation strategies.

29. The computer-implemented method according to claim 21, wherein the classifying step comprises at least one of:

a) defining current active damage mechanisms and mitigation plans;

b) collecting site-specific engineer and inspector knowledge for a task benchmarking, reliability risk ranking, and prioritization (TB&RP) processing;

c) establishing a baseline for at least one of mean time to repair (MTTR), mean time to inspect (MTTI) and mean time between failures (MTBF) from event timelines for mapping potential failures;

d) examining existing system failure root-cause analysis results to extract, map, validate and document failure causes, mechanisms, modes and locations;

e) incorporating operational consequences and map vulnerable areas resulting from the determining operational consequences determining step through use of the processor; and f) mapping the instruments identified in the instruments enabling step to physical boiler locations.

30. The computer-implemented method according to claim 29, wherein the step of defining current active damage mechanisms and mitigation plans comprises at least one of the processor:

a) compiling non-site-specific industry damage/failure data from at least one of similar system units in a fleet of systems, from OEM technical publications and from industry databases;

b) compiling data from past inspection reports for the system;

c) compiling data from a current system inspection program for the system;

d) compiling capital replacement program and timeline data;

e) compiling component modification history for the system; and f) transcribing mapped data to appropriate areas on condition monitoring plans and strategies.

31. The computer-implemented method according to claim 29, wherein the step of collecting site-specific engineer and inspector knowledge for a task benchmarking, reliability risk ranking, and prioritization (TB&RP) processing comprises at least one of;

a) laminating current system elevation diagrams to serve as damage maps;

b) mapping damage locations;

c) mapping damage types;

d) extracting root-cause opinions;

e) mapping modification locations; and f) transcribing the mapped data to appropriate areas on condition monitoring plans and strategies.

32. The computer-implemented method according to claim 29, wherein the step of examining all existing system failure root-cause analysis reports to extract, map and document failure causes, mechanisms, modes and locations comprises at least one of processing metallurgical evaluations and chemical analyses and auditing a type of and progress on corrective resolutions identified to an address root-cause, and identifying resolved root-causes as inactive.

33. The computer-implemented method according to claim 29, further comprising determining which damage mechanisms are candidates for an in-service condition monitoring through the processor and which are not candidates and handled through out-of-service testing and inspecting.

34. The computer-implemented method according to claim 21, further comprising ranking risks and prioritizing tasks associated with the inherent damage impact from the precursors.

35. The computer-implemented method according to claim 34, wherein the processor calculates risk parameters including repair time, cost and availability consequence for each identified failure, the processor combining condition monitoring outputs for failure probabilities for quantifying the risk to support decision-making, the processor further determining criticality for economic/budgetary prioritization of recommended protection schemes for all the identified failure scenarios based on benefit-to-cost.

* * * * *